(12) United States Patent
Toizumi et al.

(10) Patent No.: US 11,237,584 B2
(45) Date of Patent: Feb. 1, 2022

(54) STATE CHANGE DETECTION APPARATUS, METHOD, AND NON-TRANSITORY MEDIUM

(71) Applicant: NEC Corporation, Tokyo (JP)

(72) Inventors: Takahiro Toizumi, Tokyo (JP); Ryota Suzuki, Tokyo (JP); Shigeru Koumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 337 days.

(21) Appl. No.: 16/326,963

(22) PCT Filed: Aug. 17, 2017

(86) PCT No.: PCT/JP2017/029563
§ 371 (c)(1),
(2) Date: Feb. 21, 2019

(87) PCT Pub. No.: WO2018/038000
PCT Pub. Date: Mar. 1, 2018

(65) Prior Publication Data
US 2019/0187736 A1    Jun. 20, 2019

(30) Foreign Application Priority Data
Aug. 22, 2016   (JP) .............................. JP2016-161985

(51) Int. Cl.
| G05F 1/70 | (2006.01) |
| G01R 21/00 | (2006.01) |
| H02J 13/00 | (2006.01) |
| G01R 19/25 | (2006.01) |

(Continued)

(52) U.S. Cl.
CPC ............ *G05F 1/70* (2013.01); *G01R 19/2509* (2013.01); *G01R 19/2513* (2013.01); *G01R 21/00* (2013.01); *G01R 21/133* (2013.01); *G01R 23/20* (2013.01); *H02J 13/00* (2013.01)

(58) Field of Classification Search
CPC ... G05F 1/70; G01R 19/2509; G01R 19/2513; G01R 21/133; G01R 23/20; H02J 13/00
See application file for complete search history.

(56) References Cited

U.S. PATENT DOCUMENTS

| 9,310,401 B2 | 4/2016 | Tsao et al. |
| 9,563,530 B2 * | 2/2017 | Wada ........................ H02J 3/00 |
| 9,638,723 B2 * | 5/2017 | Takagi .............. H02J 13/00026 |

(Continued)

FOREIGN PATENT DOCUMENTS

| JP | 09229981 A | 9/1997 |
| JP | 3403368 B2 | 5/2003 |

(Continued)

OTHER PUBLICATIONS

Koumoto, et al., "Electricity Fingerprint Analysis Technology for Monitoring Power Consumption and Usage Situations of Multiple Devices by Using One Sensor" (4 pages).

(Continued)

*Primary Examiner* — Bryan Bui
(74) *Attorney, Agent, or Firm* — Sughrue Mion, PLLC

(57) ABSTRACT

A state change feature value relating to power supply current waveform data is extracted, and a transition state is detected, for a section of the waveform data, based on a magnitude of a state change feature value extracted.

17 Claims, 38 Drawing Sheets

(51) Int. Cl.
 G01R 21/133 (2006.01)
 G01R 23/20 (2006.01)

(56) References Cited

U.S. PATENT DOCUMENTS

| | | | |
|---|---|---|---|
| 10,180,461 B2 * | 1/2019 | Wada | G01R 31/3828 |
| 2012/0004871 A1 | 1/2012 | Tsao et al. | |
| 2012/0016608 A1 | 1/2012 | Ko et al. | |
| 2012/0197560 A1 | 8/2012 | Kuhns et al. | |
| 2014/0100805 A1 | 4/2014 | Takagi et al. | |
| 2015/0377935 A1 | 12/2015 | Kuhns et al. | |

FOREIGN PATENT DOCUMENTS

| | | |
|---|---|---|
| JP | 2013-150508 A | 8/2013 |
| JP | 5295322 B2 | 9/2013 |
| JP | 2014-075923 A | 4/2014 |
| JP | 2014-511096 A | 5/2014 |
| JP | 2014-171373 A | 9/2014 |

OTHER PUBLICATIONS

"Joint demonstration with Tokyo Electric Power Company Holdings on service using device disaggregation technology" (3 pages).
International Search Report of PCT/JP2017/029563 dated Oct. 31, 2017.

\* cited by examiner

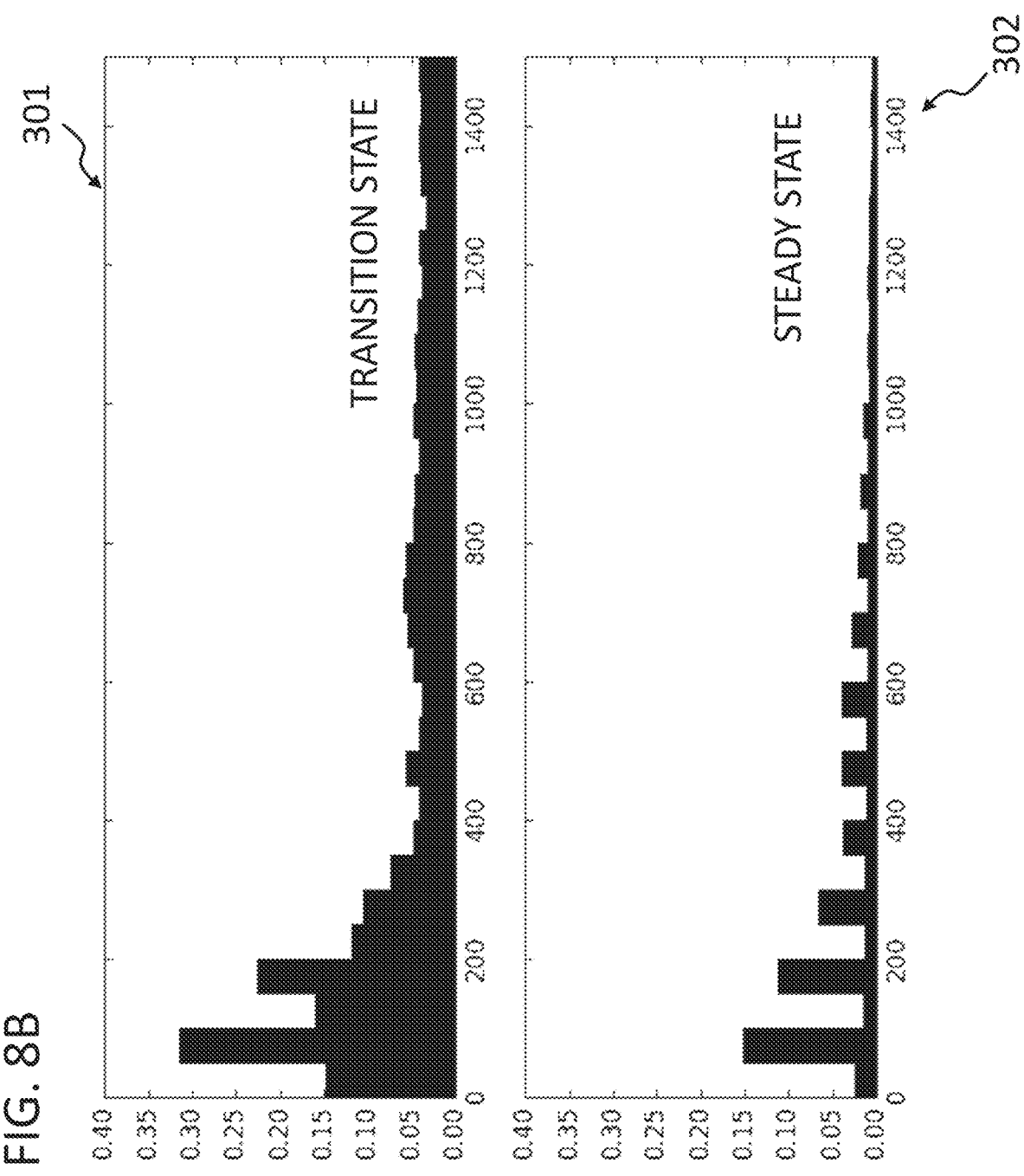

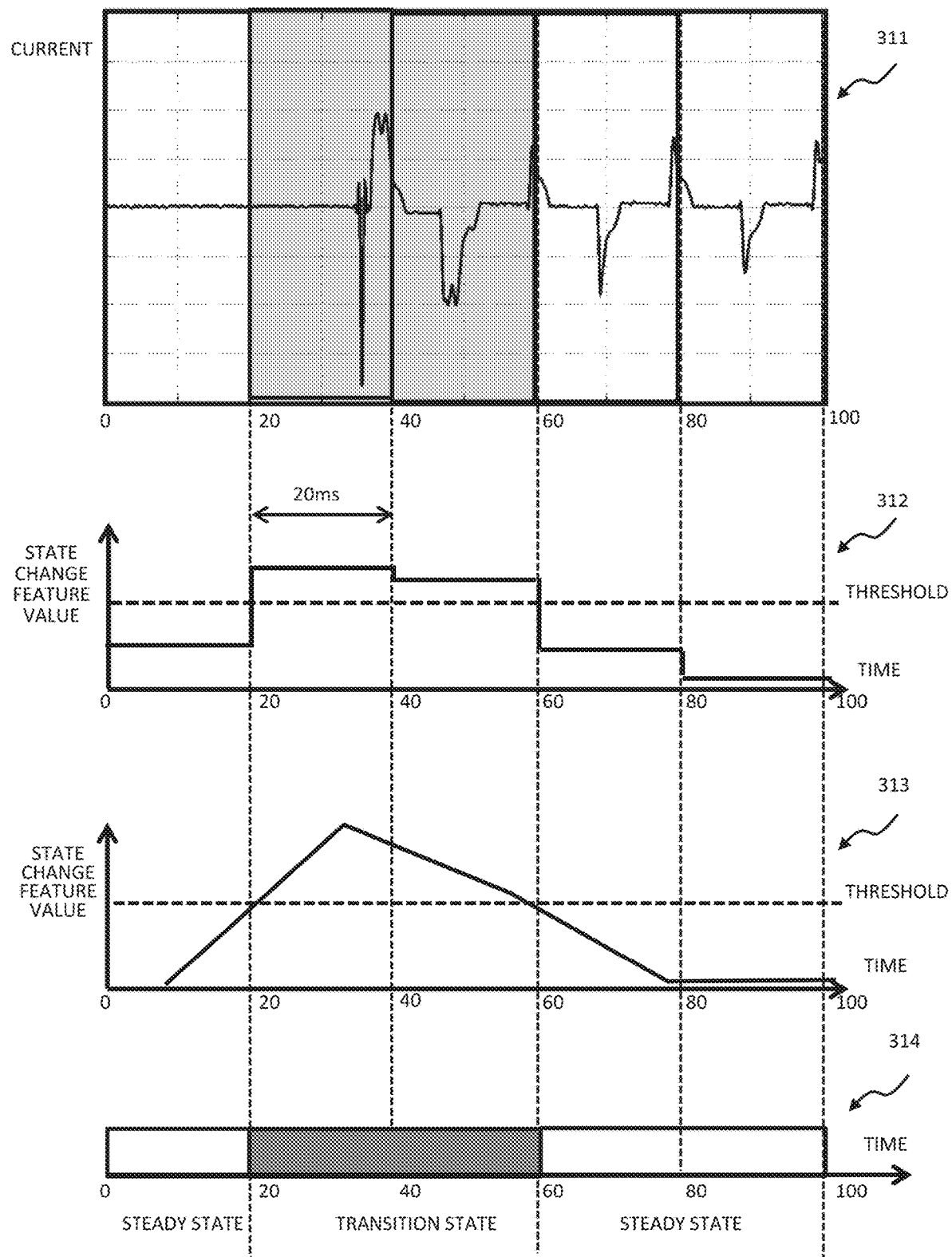

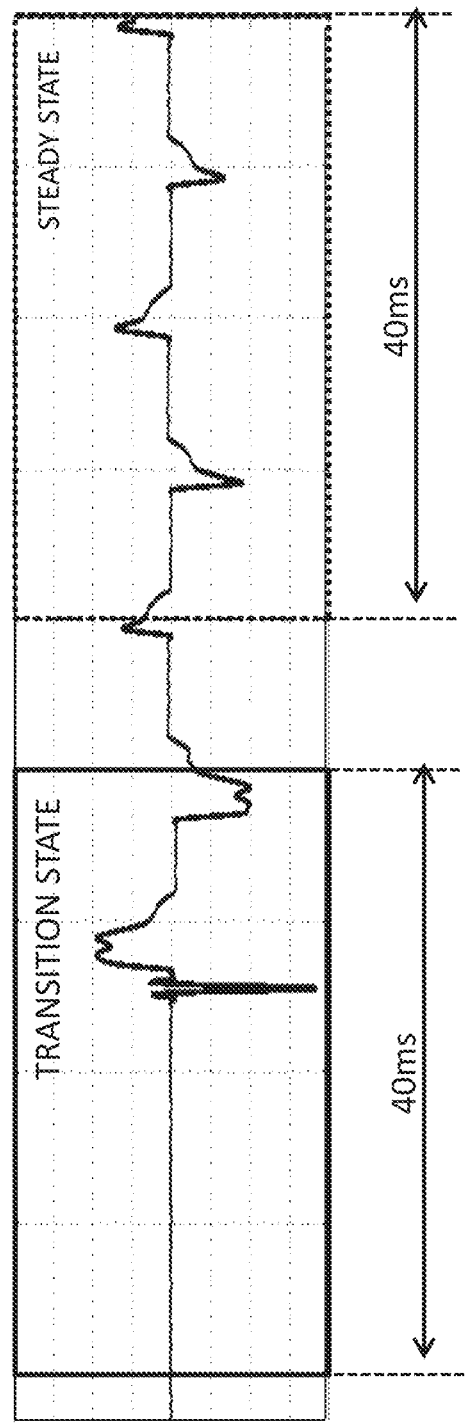

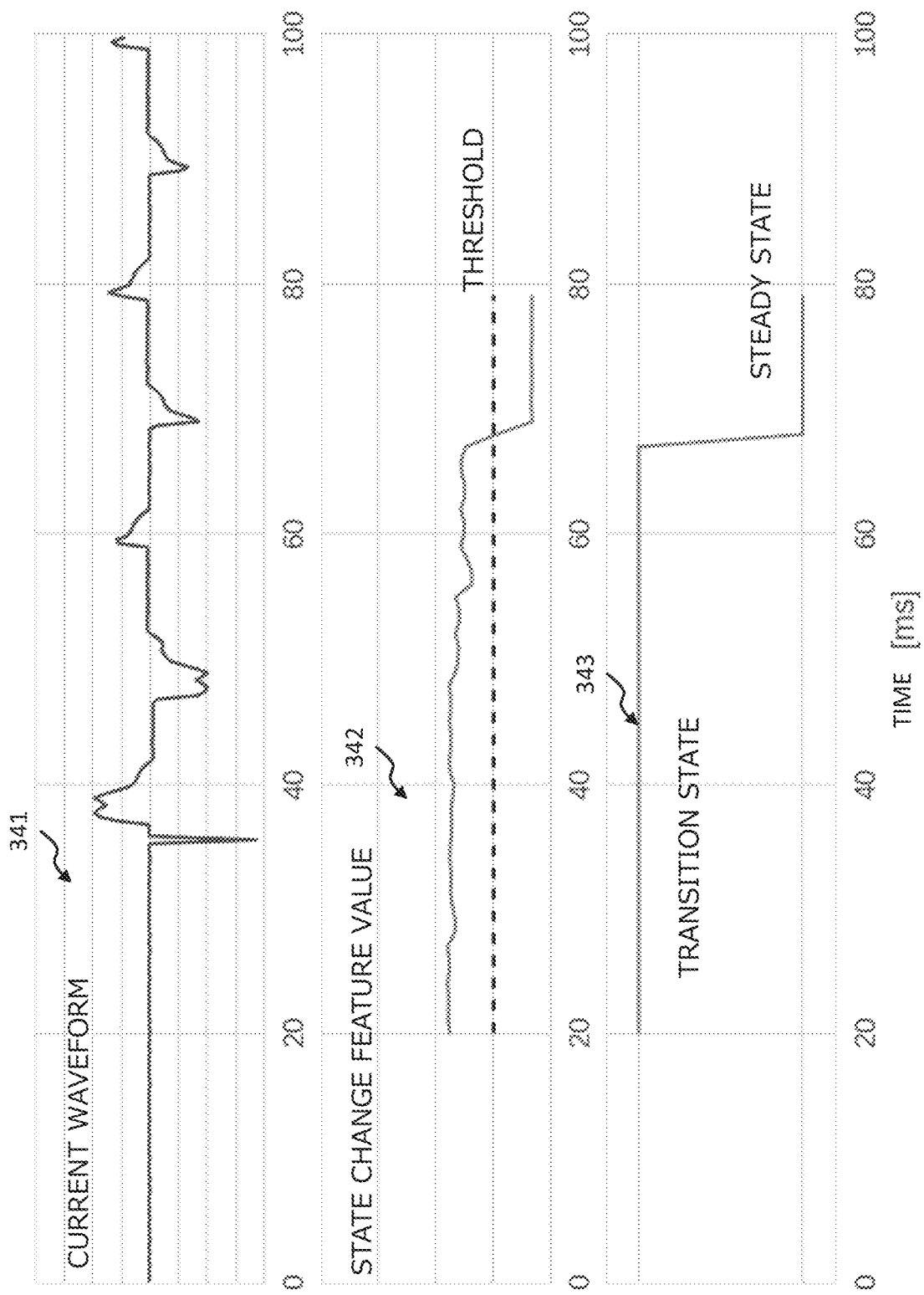

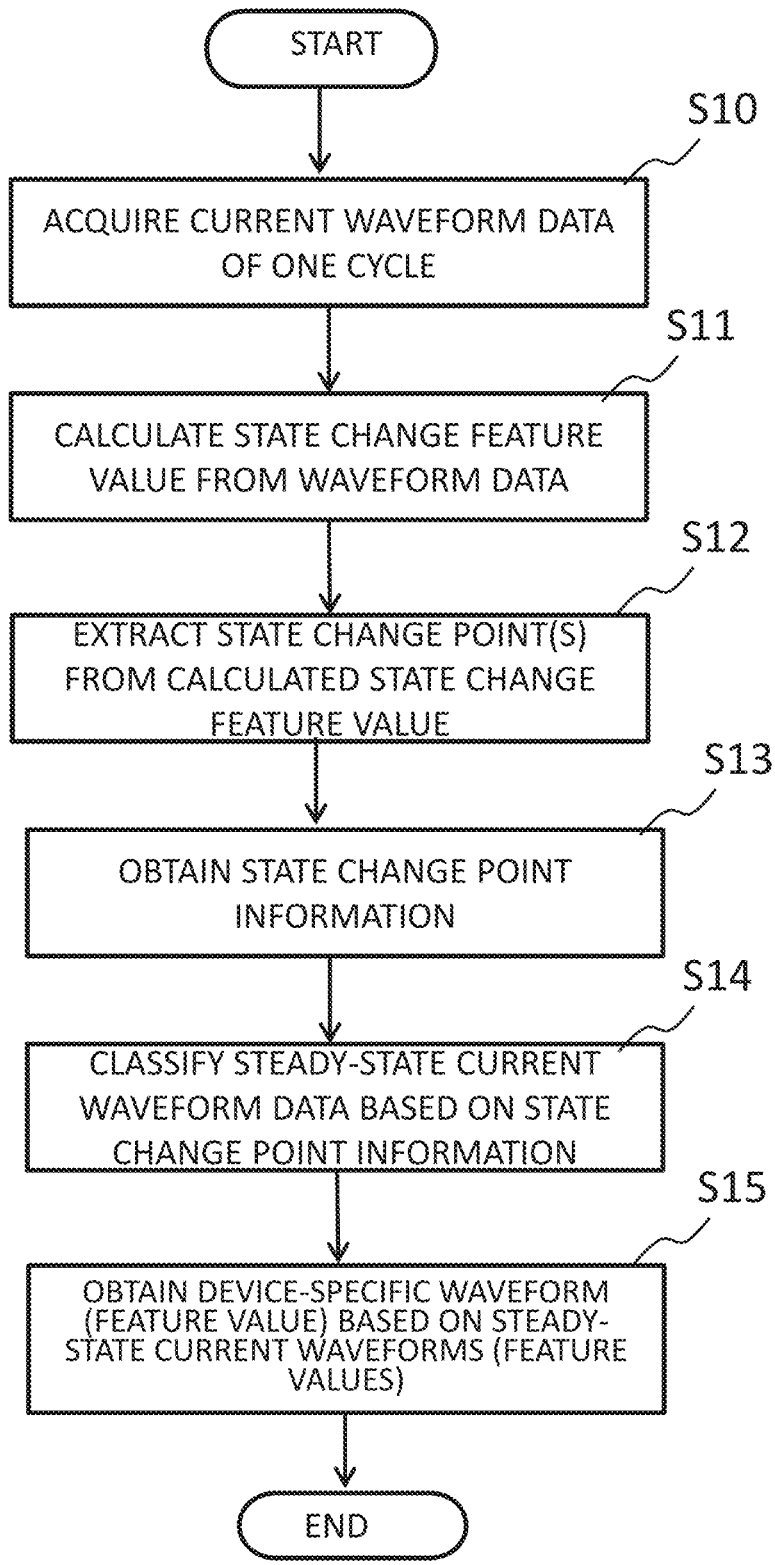

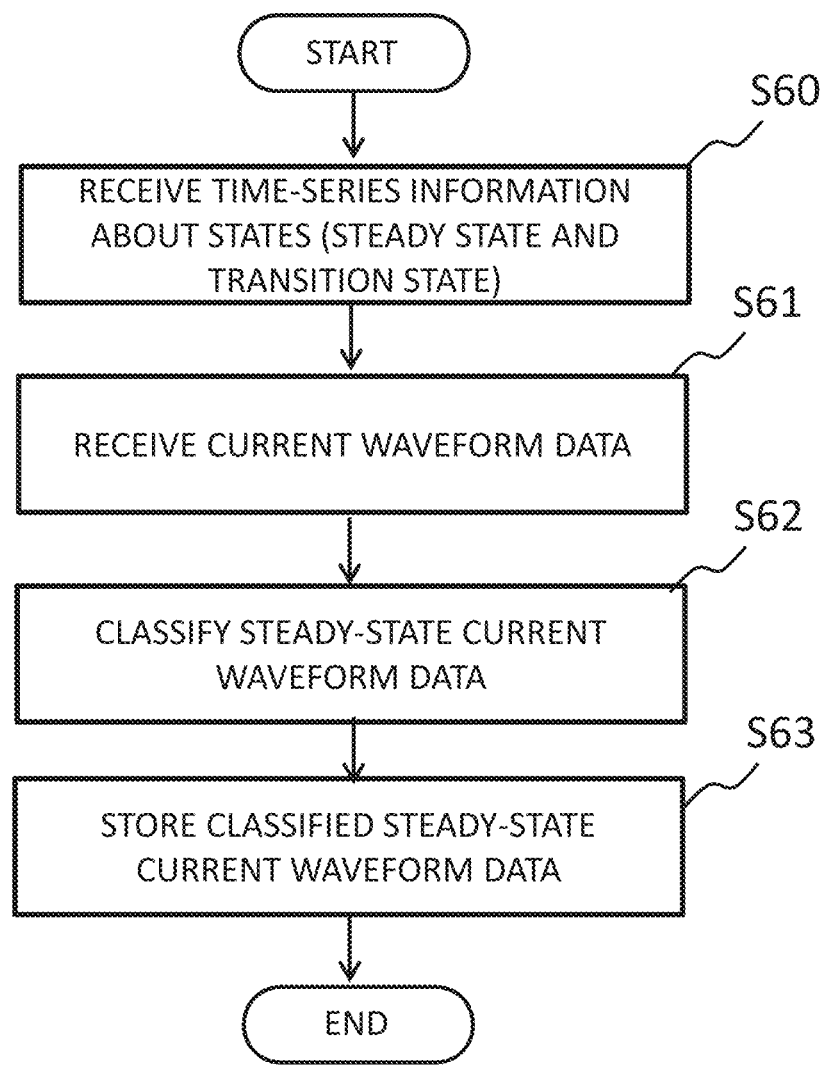

FIG. 27
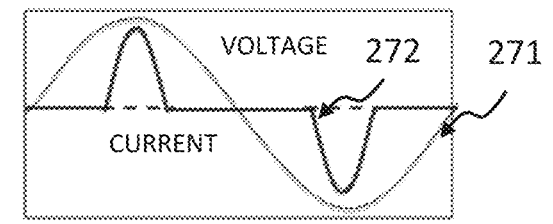
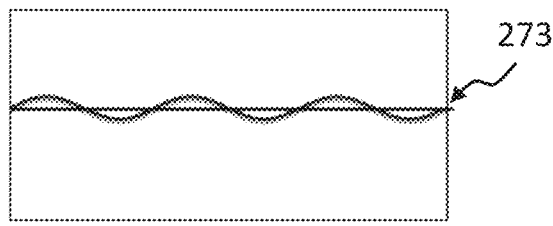
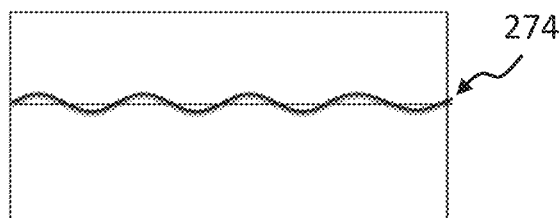
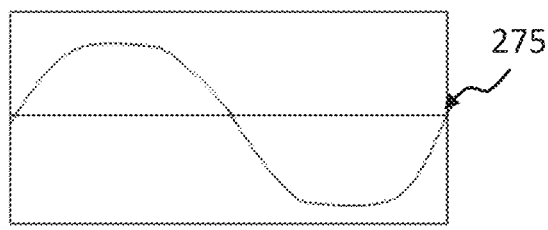
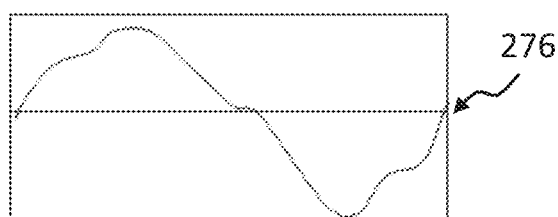
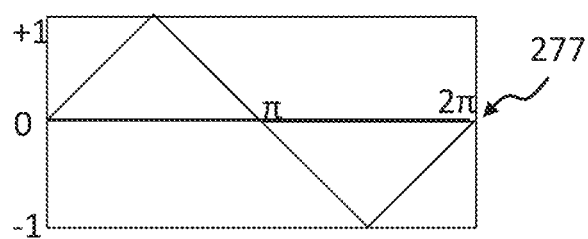

STATE CHANGE DETECTION APPARATUS, METHOD, AND NON-TRANSITORY MEDIUM

REFERENCE TO RELATED APPLICATION

This application is a National Stage Entry of PCT/JP2017/029563 filed on Aug. 17, 2017, which claims priority from Japanese Patent Application 2016-161985 filed on Aug. 22, 2016, the contents of all of which are incorporated herein by reference, in their entirety.

FIELD

The present invention is based upon and claims the benefit of the priority of Japanese patent application No. 2016-161985, filed on Aug. 22, 2016, the disclosure of which is incorporated herein in its entirety by reference thereto.

The present invention relates to an apparatus, a method, and a non-transitory medium that detect change of a state of an electrical device.

BACKGROUND

In a system in which each measurement instrument is individually installed for each electrical device (also referred to as "electrical equipment") that is arranged, for example, inside and outside of a house, a store, a factory, or the like, and an operation state of each electrical device is determined based on measured data obtained by the measurement instrument, each measurement instrument needs to be installed in each of all target electrical devices, which needs much time and effort for work. As a result, there is a problem in that much burden is imposed on a user. In addition, the system has a problem in terms of cost.

In contrast, there is a nonintrusive monitoring system (nonintrusive load monitoring: NILM) in which, based on information obtained by a measurement instrument installed near a leading wire attachment port of a building, an operation state of an individual electrical device connected downstream is estimated. In this system, since there is no need to install individually a measurement instrument for each of the electrical devices, the system does not have the above cost problem. There is also disclosed a device disaggregation technology. In this technology, for example, a waveform of a current flowing through a main switch or the like of a power distribution board is observed, and the observed current waveform is transferred to a cloud server via a communication network. Next, the waveform is disaggregated into a waveform of each electrical device by a disaggregation apparatus that is provided on a cloud server that performs disaggregation using machine learning or the like to estimate, for example, power consumption and on/off state of each electrical device (Non-patent Literature 1).

In addition, as a related technology for determining a state of an electrical device based on a power waveform, for example, Non-patent Literature 2 discloses acquiring a waveform of a current (an instantaneous waveform in one cycle) flowing through a main power line by using a current sensor attached on a power distribution board, analyzing the waveform by referring to a waveform database including information about current waveforms unique to individual devices, estimating the power consumption of each device, and determining the states of the devices such as on/off of each device.

As is well known, in a case of an inverter apparatus (for example, an inverter air-conditioner, personal computer, microwave, inverter lighting equipment, etc.) including a capacitor input type rectifier circuit (a rectifier circuit and a smoothing capacitor), distortion occurs in an input AC current, and harmonics (frequency components at integer multiples of a commercial power frequency) occur in a power supply current. If a harmonic current flows through a power-supply line, a voltage drop occurs due to impedance of the power-supply line, and harmonics also appear in a power supply voltage waveform. As a result, the electrical device, wiring equipment, or the like is negatively affected. In FIGS. 27, 271 and 272 schematically represent one cycle of a power supply voltage waveform and one cycle of a power supply current waveform, respectively, of an electrical device including a capacitor-input type rectifier circuit. As represented by the waveform 272, an input power supply current of the electrical device flows only around a peak of the power supply voltage (a sinusoidal wave), and the power supply current includes many harmonic components. In FIGS. 27, 273 and 274 represent current waveforms of the 3rd and 4th order harmonic components, respectively. In FIGS. 27, 275 and 276 represent a current waveform of a fundamental wave+a 3rd-order harmonic wave and a current waveform of the fundamental wave+a 4th-order harmonic wave, respectively.

When a first half cycle and a second half cycle of a waveform are symmetrical (vertically symmetrical), the waveform does not include any DC component nor even-order harmonics, but includes only odd harmonics waves. The current waveform 275 of the fundamental wave+the 3rd-order harmonic wave corresponds to this, which is briefly described as below.

For example, a triangular waveform ($g(\omega t)$) represented by 277 in FIG. 27 (for example, $\omega = f \times 2\pi$ and f=a commercial power frequency (fundamental frequency) of 50 Hz) is a waveform whose first and second half cycles are vertically symmetrical. Fourier series expansion of this triangular waveform is given as an expression (1), which does not include any DC component and even-order harmonic components. The following expression (1) includes only terms corresponding to the odd-order harmonic components (the fundamental wave($\omega$), the 3rd-order ($3\omega$), the 5th-order ($5\omega$), the 7th-order ($7\omega$), etc.) (Fourier series expansion of a rectangular wave whose first and second half cycles are vertically symmetrical, also includes only the odd-order harmonic components).

$$g(\omega t) = \frac{8}{\pi}\left(\sin(\omega t) - \frac{1}{3^2}\sin(3\omega t) + \frac{1}{5^2}\sin(5\omega t) - \frac{1}{7^2}\sin(7\omega t) \ldots \right) \quad (1)$$

In contrast, if a waveform includes an even-order harmonic (the 4th-order harmonic), as represented by 276 in FIG. 27, the first and second half cycles are vertically asymmetrical.

By analyzing harmonic components superimposed on a power supply current, an operation state of an individual electrical device is estimated. As a related technique, for example, Patent Literature 1 discloses an electrical device monitoring system in which an operation state of an electrical device including an inverter device can be estimated in a nonintrusive manner. This electrical device monitoring system includes: data extraction means for extracting, from measured data detected by a measuring sensor installed near a feeder wire attachment port of a power consumer, data regarding currents of a fundamental wave and harmonics and phases of the current with respect to corresponding voltages. The electrical device monitoring system also includes pattern recognition means for estimating, based on the data of the currents of the fundamental and harmonics waves and the phases of the currents with respect to the corresponding voltages obtained by the data extraction means, operation states of the electrical devices used by the power consumer. In this system, for various combinations of electrical devices and combinations of various operation states of these electrical devices, data of currents of the fundamental and harmonics waves and phases of the currents with respect to the corresponding voltages, wherein the currents and voltages having been measured by the measuring sensor, and operation states of the electrical devices, which are answers when the above combinations are used, are given as training data, and training is performed in advance. The system performs pattern recognition to estimate operation states of the electrical devices used by the power consumer based the data of currents of the fundamental and harmonics waves, and the phases of the currents with respect to the corresponding voltages, measured by the measuring sensor.

According to Patent Literature 1, current waveforms (training data) of various operation states of the electrical devices need to be prepared. In contrast, for example, Patent Literatures 2 and 3 disclose a method for estimating an operation state of an individual device by causing an apparatus to automatically collect training data. In this way, no training data needs to be prepared.

According to Patent Literature 2, nonintrusive electrical device load monitoring (NILM) is used, and time-series data of measured power or current values of a circuit is analyzed. Whether the corresponding electrical device is in a steady state or a transition state is determined by using an average and a variance of the time-series data. Patent Literature 2 discloses a method for estimating an operation state of an individual apparatus even when no training data is available.

Patent Literature 3 discloses an electric power monitoring device including a measurement module that measures a power consumption feature of a power supply and supplies power to a plurality of electrical appliances. The electric power monitoring device also includes a change detection and search module and an electrical appliance signature database that are connected to the measurement module. The change detection and search module detects and calculates change of the power consumption feature. When detecting change of the power consumption feature, based on the change, the change detection and search module searches the electrical appliance signature database to acquire at least one candidate electrical appliance corresponding to the change and the state of the candidate electrical appliance or a combination of states of a plurality of candidate electrical appliances. The change detection and search module includes a memory unit that holds the electrical appliance signature database and a search unit that is connected to the memory unit and that detects and calculates, by using a characteristic parameter list of the power consumption feature and a previous characteristic parameter list of the power consumption feature, a changed characteristic parameter list corresponding to the change. The changed characteristic parameter list includes a changed current wave, a transient current wave, a root-mean-square value of a voltage, a root-mean-square value of a current, an active power, and a reactive power. Patent Literature 3 discloses a configuration in which an operation state of an individual device is estimated by setting a threshold for "time-series change" of a change characteristic parameter even when no training data is available.

Patent Literature 4 discloses a configuration in which a harmonic current signal is sampled and digitized. In addition, frequency analysis is performed on the digitized signal, and a monitoring value and an alarm time are set on a per order basis. When a measured value exceeds a corresponding monitoring value, a corresponding alarm contact is driven. Based on received data, a central monitoring apparatus determines a direction of a harmonic current and the harmonic source. Patent Literature 4 discloses a content rate per odd-order harmonic such as the 3rd-, 5th-, or 7th-order harmonics and setting examples of the monitoring values for these orders. Patent Literature 4 is mainly directed to quasi-steady harmonics that fluctuate moderately. Namely, Patent Literature 4 is not directed to sudden harmonics that appear in an instantaneous waveform.

Patent Literature 5 discloses a state estimation device including: a harmonic component calculation unit that acquires measurement information on power and current supplied to a power system to which a plurality of consumer devices can be connected and that calculates a first harmonic component, which is a harmonic component of the power, and a second harmonic component, which is a harmonic component of the current; a database that can hold the harmonic content rate of power needed by an individual one of the plurality of consumer devices; and a state estimation unit that estimates the active power of the individual consumer device and a resistance value in the power system by representing the first harmonic component using a first power obtained from the active power of the individual consumer device and the corresponding harmonic content rate and second power obtained from a resistance value in the power system and the second harmonic component.

Patent Literature 6 discloses a current waveform determination apparatus including: a database that holds a waveform of a current flowing through an individual one of a plurality of devices as a reference waveform; current waveform measurement means for measuring a waveform of a current flowing through a power supply line on a per power supply frequency cycle basis; steady state determination means for determining a transient state if a change amount of the current waveform on a per cycle basis exceeds a predetermined threshold and determining a steady state if the change amount is equal to or less than the threshold; difference waveform calculation means for calculating, if a first steady state has changed to a second steady state via a transient state, a difference waveform, obtained by a difference between a current waveform measured in the second steady state and a current waveform measured in the first steady state; and determination means for comparing the difference waveform with individual reference waveforms in the database, selecting a reference waveform that best matches the difference waveform, and determining a device corresponding to the selected reference waveform to be a device whose operation state has changed in the transient state. According to Patent Literature 6, a measured current waveform is compared with a current waveform in the previous cycle.

CITATION LIST

Patent Literature

Patent Literature 1: Japanese Patent No. JP3403368B
Patent Literature 2: Japanese Translation of PCT International Application Publication No. JP-2014-511096A Patent Literature 3: Japanese Patent No. JP5295322B
Patent Literature 4: Japanese Patent Kokai Publication No. JP-H09-229981A
Patent Literature 5: Japanese Patent Kokai Publication No. JP-2014-171373A
Patent Literature 6: Japanese Patent Kokai Publication No. JP-2013-150508A Non-Patent Literature Non-Patent Literature 1

"Joint demonstration with Tokyo Electric Power Company Holdings on service using device disaggregation technology", Informetis Co., Ltd. [searched on May 1, 2016] Internet (URL:http://prtimes.jp/main/html/rd/p/000000001.000012366.html)

Non-Patent Literature 2

Shigeru Koumoto, Takahiro Toizumi, Eisuke Saneyoshi, "Electricity Fingerprint Analysis Technology for Monitoring Power Consumption and Usage Situations of Multiple Devices by Using One Sensor", NEC Technical Journal/Vol. 68 No. 2/Special Issue on NEC's Smart Energy Solutions Led by ICT

SUMMARY

Hereinafter, the related technologies will be analyzed.

In the configurations disclosed in the above Patent Literatures 2 and 3, etc., a feature value of an individual instantaneous waveform is individually extracted from an individual waveform, and time-series change is detected from time-series data of the extracted feature value by using difference or standard deviation.

Namely, none of the above literatures disclose a technique that can acquire information about change of a state directly from an instantaneous waveform.

The present invention has been made based on recognition of the above problem, and an object of the present invention is to provide an apparatus, a method, and a non-transitory medium storing a program, each enabling to acquire information about change of a state directly from an instantaneous waveform.

According to an aspect of the present invention, there is provided a state change detection apparatus comprising:

a processor; and a memory including program instructions that, when executed by the processor, cause the processor to:

extract a state change feature value relating to waveform data of a power supply current; and detect a transition state for a section of the waveform data, based on a magnitude of the state change feature value extracted.

According to another aspect of the present invention, there is provided a computer based method of detecting a state change of an electrical device, the method comprising:

extracting a state change feature value relating to power supply current waveform data; and detecting a transition state based on a magnitude of a state change feature value extracted from an individual section of the waveform data.

According to still another aspect of the present invention, there is provided a non-transitory computer readable recording medium storing therein a program, the program causing a computer to execute:

extracting a state change feature value relating to power supply current waveform data; and detecting a transition state based on a magnitude of a state change feature value extracted from an individual section of the waveform data.

According to the present invention, information about change of a state can be obtained directly from an instantaneous waveform.

BRIEF DESCRIPTION OF THE DRAWINGS

FIG. 8B is a diagram illustrating a frequency spectrum in one cycle (a transition state) and a frequency spectrum in one cycle (a steady state) in FIG. 8A.

FIG. 9 is a diagram illustrating a correspondence relationship among a current waveform, transition of a state change feature value obtained by Fourier transform per cycle (20 ms), transition of a state change feature value obtained by short-time Fourier transform, and a transition state detection result.

FIG. 11A is a diagram illustrating a current waveform.

FIG. 12 is a diagram illustrating a current waveform, transition of a state change feature value, and a transition state detection result (two cycles).

FIG. 18 is a diagram illustrating an operation according to the fourth example embodiment of the present invention.

FIG. 20B is a flowchart illustrating an operation of the steady state separation, extraction and storage unit according to the fourth example embodiment of the present invention.

FIG. 27 illustrates harmonics of a power supply current.

DETAILED DESCRIPTION

First Example Embodiment

Figure 1:
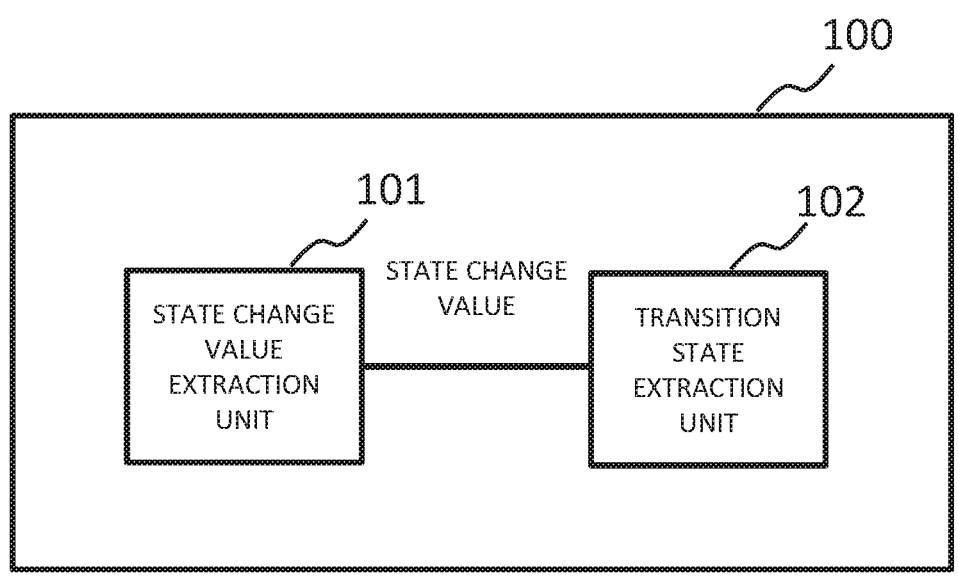
FIG. 1 is a diagram illustrating a configuration according to a first example embodiment of the present invention.

Next, an example embodiment of the present invention will be described in detail with reference to drawings. FIG. 1 illustrates a configuration according to a first example embodiment of the present invention.

As illustrated in FIG. 1, a state change detection apparatus 100 includes: a state change feature value extraction unit 101 that extracts a state change feature value relating to power supply current waveform data; and a transition state extraction unit 102 that detects a transition state based on a magnitude of a state change feature value extracted from an individual section of the waveform data. The units 101 and 102 of the state change detection apparatus 100 may be incorporated within a single apparatus (housing). Alternatively, the units 101 and 102 may be separately disposed in different nodes and mutually connected by communication means.

The state change feature value extraction unit 101 performs Fourier transform (for example, FFT (Fast Fourier Transform), DFT (Discrete Fourier Transform), or the like) on a power supply current waveform.

When the state change feature value extraction unit 101 performs discrete Fourier transform on a power supply current waveform in which sampling point number=N (for example, a power of 2) (a discrete-time signal waveform) $g(i)$ ($i=0, \ldots, N-1$), the state change feature value extraction unit 101 obtains $G(n)$ ($n=0$ to $N-1$):

$$G(n) = \frac{1}{N}\sum_{k=0}^{N-1} g(k)\exp\left(-\frac{2\pi nk}{N}\right) \qquad (2)$$

In the above expression (2), G(0) represents a DC component. The first half ($G(1)$ to $G(N/2-1)$) and the second half ($G(N/2+1)$ to $G(N-1)$) in the frequency range have reflectional symmetry around a Nyquist frequency ($G(N/2)$). An intensity (an amplitude component) $I(j)$ of a frequency spectrum $G(j)$ is given by a square root of the sum of a square of a real part $Re(G(j))$ and a square of an imaginary part $Im(G(j))$ as follows.

$$I(j)=\sqrt{(Re(G(j))^2+(Im(G(j))^2} \qquad (3)$$

Among the above frequency components, for example, the sum of the intensities (amplitude components) $I(j)$ of the frequency components other than odd-order harmonic components of the corresponding commercial power frequency is used as a state change feature value (a feature value) FV.

$$FV = \sum_{j\in E} I(j) \qquad (4)$$

In the above expression (4), an index j (group E) for calculating the sum $\Sigma$ of the intensities $I(j)$ represents, among the integers of 0 to N/2 (corresponding to the frequency spectra ($G(0)$ to $G(N/2)$), the order numbers of the frequency components other than odd-order harmonic components of the commercial power frequency and includes 0.

Among the frequency components, for example, the sum of the n-th powers of the individual intensities (amplitude components) $I(j)$ of the frequency components other than odd-order harmonic components of the commercial power frequency may be used as a state change feature value (a feature value) FV.

$$FV = \sum_{j\in E} I(j)^n \qquad (5)$$

In the above expression (5), n is an integer of 2 or more, for example.

Based on the power supply current waveform data of an electrical device stored in advance in a storage device (not illustrated) of the state change detection apparatus 100, the state change feature value extraction unit 101 may calculate a state change feature value about the power supply current waveform data. This storage device may be an external storage device connected to the state change detection apparatus 100. For example, the storage device may be a database device or the like that can be accessed by the state change feature value extraction unit 101 of the state change detection apparatus 100 via communication means such as a network.

The transition state extraction unit 102 compares the magnitude of the state change feature value calculated by the state change feature value extraction unit 101 with a preset threshold to determine whether a section of the current waveform data on which Fourier transform has been performed (for example, a length of the section is one cycle or less of the commercial power frequency) corresponds to a transition state such as on/off of the electrical device or an internal control operation of the electrical device or to a steady state of the electrical device.

For example, when the magnitude of the state change feature value in the section of the current waveform data is equal to or less than the threshold, the transition state extraction unit 102 may determine that the section corresponds to a steady state. When the magnitude of the state change feature value in the section of the current waveform data is over the threshold, the transition state extraction unit 102 may determine that the section corresponds to a transition state.

The state change feature value extraction unit 101 may perform short-time Fourier transform in which a start point of a time interval of the current waveform, the time interval being subjected to Fourier transform, is shifted step by step (by time Δt), wherein the time section (time interval) is extracted by multiplying a window function with a constant length to the current waveform. The state change feature value extraction unit 101 may obtain temporal change (time-series data) of the state change feature value from the corresponding current waveform. The transition state extraction unit 102 may determine whether an individual section corresponds to a steady state or a transition state per time Δt (<20 ms (millisecond): a length of one cycle of the commercial power frequency). In this case, the time resolution of the determination of the transition state is given by Δt.

Figure 2:
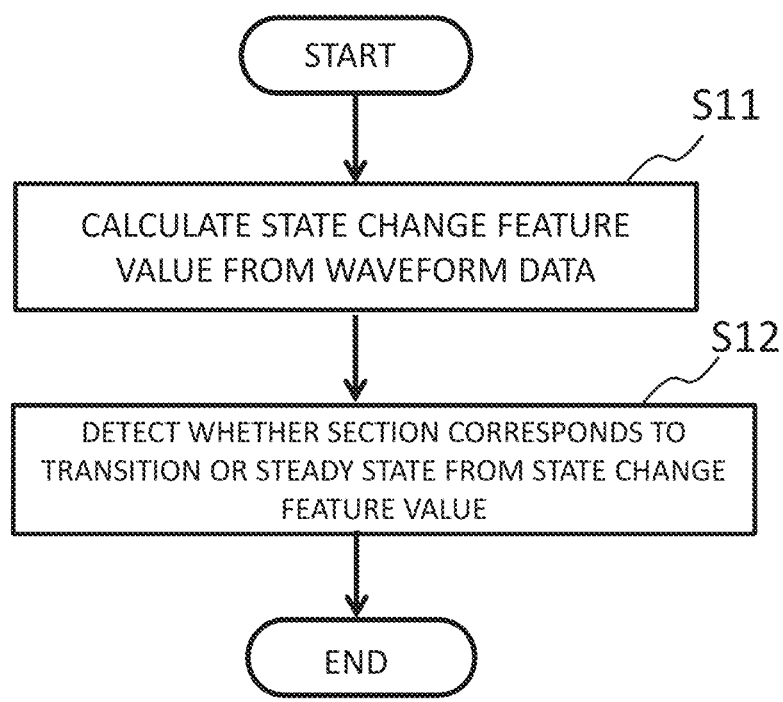
FIG. 2 is a flowchart illustrating an overall operation according to the first example embodiment of the present invention.

FIG. 2 is a flowchart illustrating an overall operation according to the first example embodiment. As illustrated in FIG. 2, the state change feature value extraction unit 101 calculates a state change feature value based on power supply current waveform data (step S11).

Next, based on a magnitude of a state change feature value extracted from an individual section of the current waveform data, the transition state extraction unit 102 detects whether the corresponding section corresponds to a steady state or a transition state (step S12). Based on the time-series data of these state change feature values, the transition state extraction unit 102 may extract a change point of a state (a change point from a steady state to a transition state or a change point from a transition state to a steady state).

Second Example Embodiment

Figure 3:
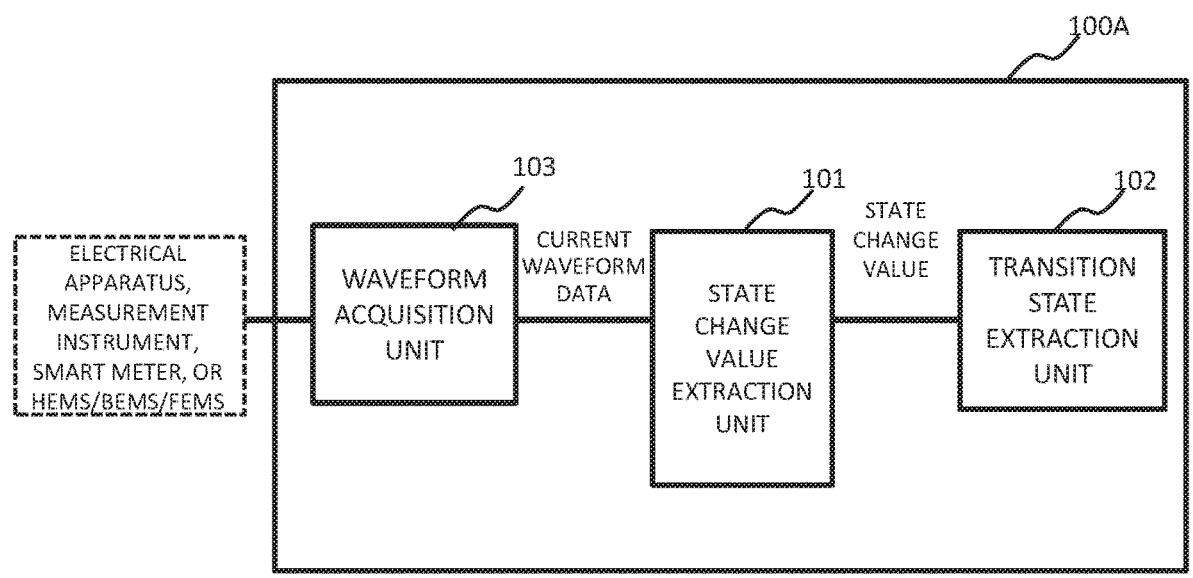
FIG. 3 is a diagram illustrating a configuration according to a second example embodiment of the present invention.

FIG. 3 illustrates a configuration according to a second example embodiment of the present invention. As illustrated in FIG. 3, a state change detection apparatus 100A according to the second example embodiment includes a waveform acquisition unit 103, in addition to the configuration of the state change detection apparatus 100 in FIG. 1. For example, the waveform acquisition unit 103 may acquire current waveform data (alternatively, current waveform data and voltage waveform data or current waveform data and instantaneous power waveform data) from at least one of:
a measurement instrument installed on an individual electrical device,
a smart meter, and
a controller (a gateway) such as a HEMS (a Home Energy Management System), a BEMS (a Building Energy Management System), a FEMS (a Factory Energy Management System), or the like.

The waveform acquisition unit 103 may be configured to include a measurement instrument that measures a power supply current of an individual electrical device. Alternatively, the waveform acquisition unit 103 may be configured to obtain, via communication means or the like, waveform data that is acquired by a measurement instrument that measures a power supply current of an individual electrical device.

Figure 24A:
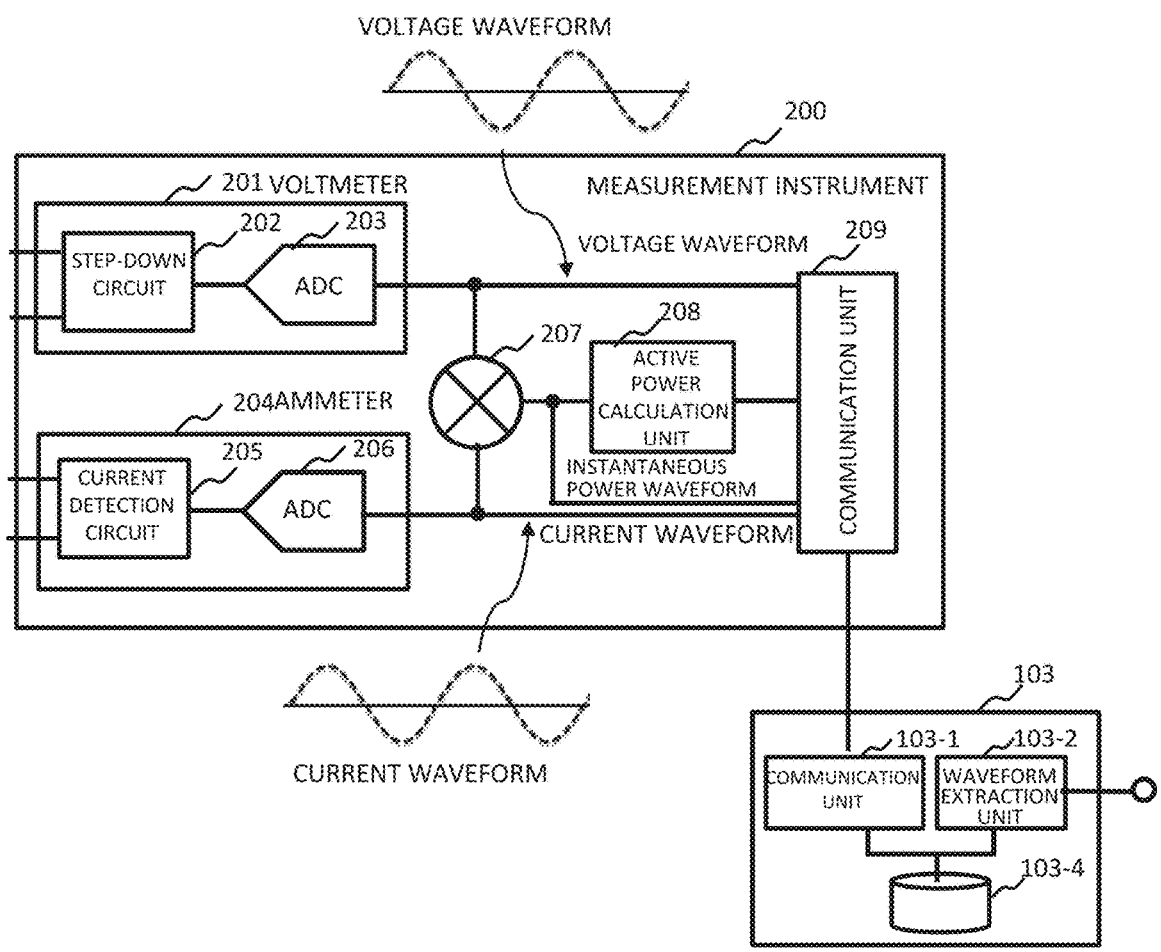
FIG. 24A is a diagram for describing the second example embodiment of the present invention, illustrating an example of a measurement instrument and a configuration of waveform acquisition unit.
Figure 24B:
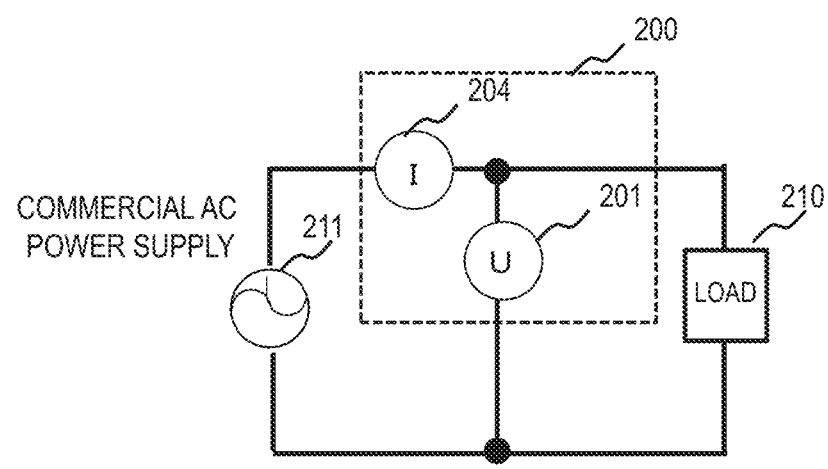
FIG. 24B illustrates connection of an ammeter and a voltmeter in FIG. 24A.

FIG. 24A schematically illustrates a configuration of a measurement instrument 200 with which the waveform acquisition unit 103 in FIG. 3 is communicatively connected. While FIG. 24A illustrates a configuration of a single-phase two-wire A.C. system for simplicity, for example, a current can be measured by using three single-phase power meters in the case of a three-phase three-wire A.C. system. Alternatively, power may be measured based on a two-power meter method. In FIG. 24A, the measurement instrument 200 may include a voltmeter 201 (U in FIG. 24B) that measures a voltage between terminals of a load 210 in FIG. 24B and an ammeter 204 (I in FIG. 24B) that measures a current flowing through the load 210 in FIG. 24B. The voltmeter 201 may include a step-down circuit 202 that drops a voltage between the terminals of the load 210 and an analog-digital converter (ADC) 203 that converts an analog output voltage outputted by the step-down circuit 202 to a digital signal. The ammeter 204 may include a current detection circuit 205 that detects a current flowing through a power-supply line (the load 210) and an ADC 206 that convers an analog output voltage outputted by the current detection circuit 205 to a digital signal. For example, the current detection circuit 205 may measure a voltage between terminals of a shunt resistor (not illustrated) inserted in the power supply line. Alternatively, the current detection circuit 205 may have a configuration of a current transformer (CT) sensor having a coil wound around a magnetic core or the like. In this case, a cable whose current is to be measured is tucked in a CT sensor, and the CT sensor detects a current converted from a detection value of the magnetic flux flowing inside the magnetic core.

Voltage waveform data from the ADC 203 of the voltmeter 201 and current waveform data from the ADC 206 of the ammeter 204 are multiplied, for example, by a multiplier 207, and an instantaneous power waveform is obtained. An active power calculation unit 208 performs smoothing of the instantaneous power waveform to calculate an active power value. The voltage waveform data, the power waveform data, the instantaneous power waveform, and the active power value are inputted to a communication unit 209 and are transmitted to the waveform acquisition unit 103 of the state change detection apparatus 100 in FIG. 3. A predetermined DC power supply voltage may be supplied to the ADCs 203 and 206, the multiplier 207, the active power calculation unit 208, and the communication unit 209 via an AC (Alternate Current)-DC (Direct Current) converter (not illustrated) that converts the commercial AC power supply into a DC power supply and a DC-DC converter that converts the output DC voltage from the AC-DC converter into another DC voltage.

As illustrated in FIG. 24A, the waveform acquisition unit 103 of the state change detection apparatus 100 may include, for example, a communication unit 103-1, a waveform extraction unit 103-2, and a storage device 103-4. The communication unit 103-1 receives necessary waveform data among current waveform data, voltage waveform data, instantaneous power waveform, etc. by communicating with the communication unit 209 of the measurement instrument 200 via a network or the like and stores received waveform data in the storage device 103-4. Regarding the current waveform data received from the measurement instrument 200, the communication unit 103-1 may store in the storage device 103-4, for example, an identification number (identification name) (Identity: ID) of the measurement instrument 200 (or an ID of an electrical device measured) and information about sampling time of the power supply current waveform data. The waveform extraction unit 103-2 extracts a necessary length (for example, one cycle) of waveform data from the waveform data (for example, the current waveform data) stored in the storage device 103-4.

In FIG. 3, the waveform acquisition unit 103 may be connected to or include a measurement instrument. Alternatively, the waveform acquisition unit 103 may perform waveform disaggregation on power consumption or current waveform acquired from a smart meter, a current sensor, or the like, to acquire power supply current waveform of an individual electrical device (with a length equal to or less than one cycle of the commercial power frequency, for example).

Figure 25A:
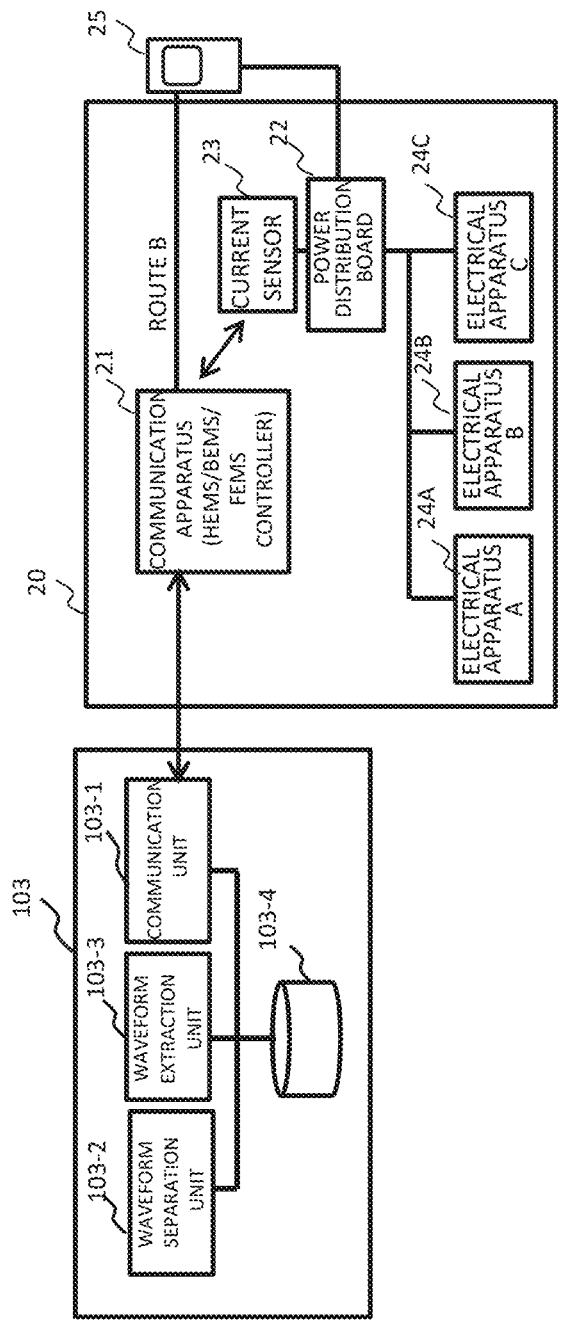
FIG. 25A is a diagram for describing the second example embodiment of the present invention.

FIG. 25A schematically illustrates an example in which the waveform acquisition unit 103 in FIG. 3 performs electrical device disaggregation on a power supply current waveform. As illustrated in FIG. 25A, in a building 20 of a power consumer, a communication apparatus 21 is formed as a controller such as a HEMS/BEMS/FEMS, and measured data (power consumption, a current value, or the like) of a smart meter 25 is acquired via route B, for example. The measured data (power consumption, a current value, or the like) acquired by the controller from the smart meter 25 via route B includes information about power consumption at the whole building. Alternatively, a current sensor 23 that detects a current flowing through a main breaker (not illustrated) or a branch breaker (not illustrated) connected to a main power line of a power distribution board 22 may be arranged in at least one of the main breaker and the branch breaker, and current waveform data may be transmitted from the current sensor 23 to the communication apparatus 21 via wireless transmission or the like. The current sensor 23 may include a current transformer (CT) (for example, a zero-phase-sequence current transformer (ZCT)) or a Hall element, for example. The current sensor 23 may use an ADC (not illustrated) to sample a current waveform (an analog signal) and convert the current waveform to a digital signal, use an encoder (not illustrated) to perform compression coding, and wirelessly transmit a compression coded signal to the communication apparatus 21 via a wireless smart utility network (Wi-SUN) or the like.

Figure 25B:
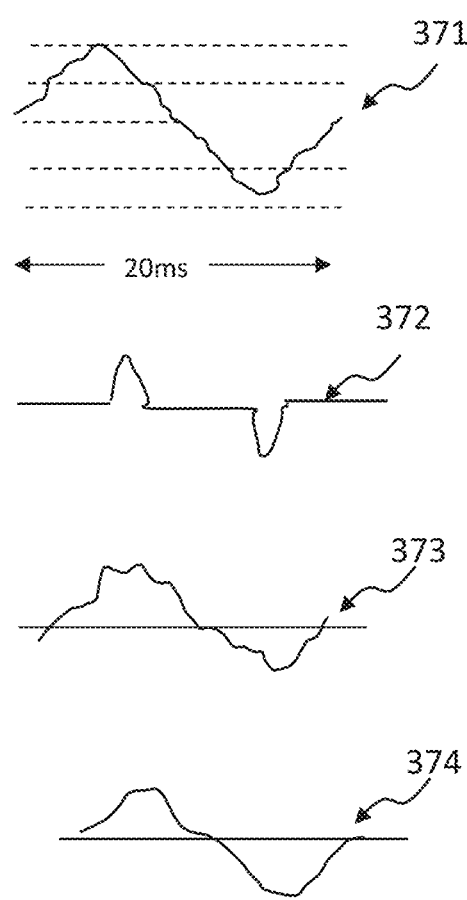
FIG. 25B is a diagram illustrating a synthesized waveform and disaggregated waveforms in FIG. 25A.

In addition, as illustrated in FIG. 25A, the waveform acquisition unit 103 of the state change detection apparatus 100 includes a communication unit 103-1, a waveform extraction unit 103-2, a waveform disaggregation unit 103-3, and a storage device 103-4. The communication unit 103-1 communicates with the communication apparatus 21 via a network or the like, obtains power supply current waveform acquired by the current sensor 23, the smart meter 25, or the like, and stores the power supply current waveform in the storage device 103-4. In FIG. 25B, 371 schematically illustrates a current waveform (one cycle of the commercial power supply) acquired by the current sensor 23 or the smart meter 25 connected to the main breaker or the branch breaker(s) (not illustrated) of the power distribution board 22 in FIG. 25A. For example, by using the techniques in Non-patent Literatures 1 and 2, or the like, the waveform disaggregation unit 103-3 disaggregates the current waveform data 371 in FIG. 25B into power supply current waveforms of electrical devices 24A to 24C connected to the main breaker or the branch breaker of the power distribution board 22 and stores the obtained current waveforms in the storage device 103-4. The waveform disaggregation unit 103-3 may store IDs of the electrical devices corresponding to the disaggregated power supply current waveform data and information, for example, about the sampling time of the corresponding power supply current waveform data in the storage device 103-4. In FIG. 25B, 372 to 374 represent the disaggregated current waveforms of the respective electrical devices 24A to 24C in FIG. 25A. The waveform disaggregation unit 103-3 may acquire the power supply current waveform data of the electrical devices 24A to 24C from measured data (power consumption, current value, etc.) acquired from the smart meter 25 via route B. For example, among the measured data acquired by the smart meter 25, by analyzing data representing time-series change of the current value by using analysis means such as machine learning, signal processing technology, or the like, the power supply current waveform data per device may be obtained.

In FIG. 25A, the waveform extraction unit 103-2 extracts a necessary length (for example, one cycle) of current waveform data of a target electrical device from the waveform data (for example, the current waveform data) of the electrical devices stored in the storage device 103-4.

As illustrated in FIG. 3, as in the first example embodiment, the state change feature value extraction unit 101 performs Fourier transform (for example, FFT or DFT) on the current waveform data acquired by the waveform acquisition unit 103. Among the frequency components, for example, the sum of the intensities (or the sum of the n-th powers) of the frequency components other than odd-order harmonic components of the commercial power frequency (the above expression (4) or (5)) is used as a state change feature value (a feature value) FV.

Based on current waveform data stored in advance in a storage device of the state change detection apparatus 100A, the state change feature value extraction unit 101 may calculate the state change feature value about the current waveform data. For example, this storage device may be the storage device 103-4 of the waveform acquisition unit 103 in FIG. 24A or FIG. 25A or a storage device (for example, a storage device 112 in FIG. 26 to be described below) inside the state change detection apparatus 100A. Alternatively, the storage device may be an external storage device connected to the state change detection apparatus 100. For example, the storage device may be a database device or the like that can be accessed by the state change feature value extraction unit 101 of the state change detection apparatus 100 via communication means such as a network.

In FIG. 3, as in the first example embodiment, the transition state extraction unit 102 compares the magnitude of the state change feature value calculated by the state change feature value extraction unit 101 with a preset threshold and determines whether an individual section of the current waveform data, the section subjected to Fourier transform (for example, a length of the section is equal to or less than one cycle of a commercial power frequency), corresponds to a transition state such as on/off of the electrical device or an internal control operation of the apparatus or to a steady state of the electrical device. For example, when a magnitude of the state change feature value in a section of the current waveform data is equal to or less than the threshold, the transition state extraction unit 102 may determine that the section of the current waveform data corresponds to a steady state. When a magnitude of the state change feature value in the section of the current waveform data is over the threshold, the transition state extraction unit 102 may determines that the section of the current waveform data corresponds to a transition state.

As in the first example embodiment, the state change feature value extraction unit 101 may perform short-time Fourier transform in which a time section of the current waveform extracted by multiplying a window function is shifted (by time Δt) step by step, to obtain temporal change (time-series data) of the state change feature value from the corresponding current waveform. The transition state extraction unit 102 may determine whether an individual section corresponds to a steady state or a transition state per time Δt (<20 ms).

Figure 4:
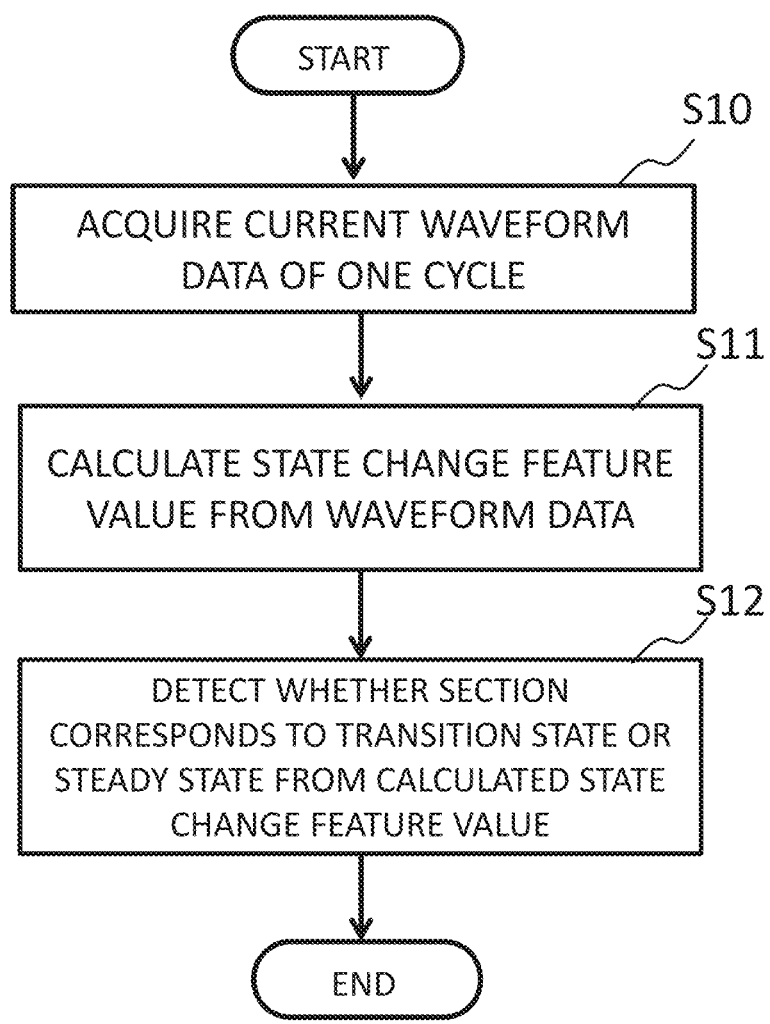
FIG. 4 is a flowchart illustrating an overall operation according to the second example embodiment of the present invention.

FIG. 4 is a flowchart illustrating an overall operation according to the second example embodiment of the present invention. As illustrated in FIG. 4, the waveform acquisition unit 103 in FIG. 3 acquires a power supply current waveform of one cycle of the commercial power frequency (step S10). In this step S10, as described with reference to FIG. 24A, the waveform acquisition unit 103 may acquire a power supply current waveform and an instantaneous power waveform of an electrical device from the measurement instrument 200 connected to the electrical device (the load 210). Alternatively, as described with reference to FIGS. 25A and 25B, the waveform acquisition unit 103 may acquire a power supply current waveform from a current sensor (the current sensor 23 in FIG. 25A) or a smart meter (25 in FIG. 25A) connected to a main breaker or a branch breaker(s) of a power distribution board and may cause the waveform disaggregation unit (103-3 in FIG. 25A) to use device disaggregation technology or the like to disaggregate the power supply current waveform into the power supply currents and instantaneous power waveforms of the individual electrical devices.

Next, based on the waveform data acquired by the waveform acquisition unit 103, the state change feature value extraction unit 101 calculates a state change feature value (step S11).

Next, based on the magnitude of the state change feature value extracted from a section of the power supply current waveform data, the transition state extraction unit 102 detects whether the section corresponds to a steady state or a transition state (step S12). The transition state extraction unit 102 may extract a change point of a state based on time-series data of the state change feature value (a change point from a steady state to a transition state or a change point from a transition state to a steady state).

Figure 5A:
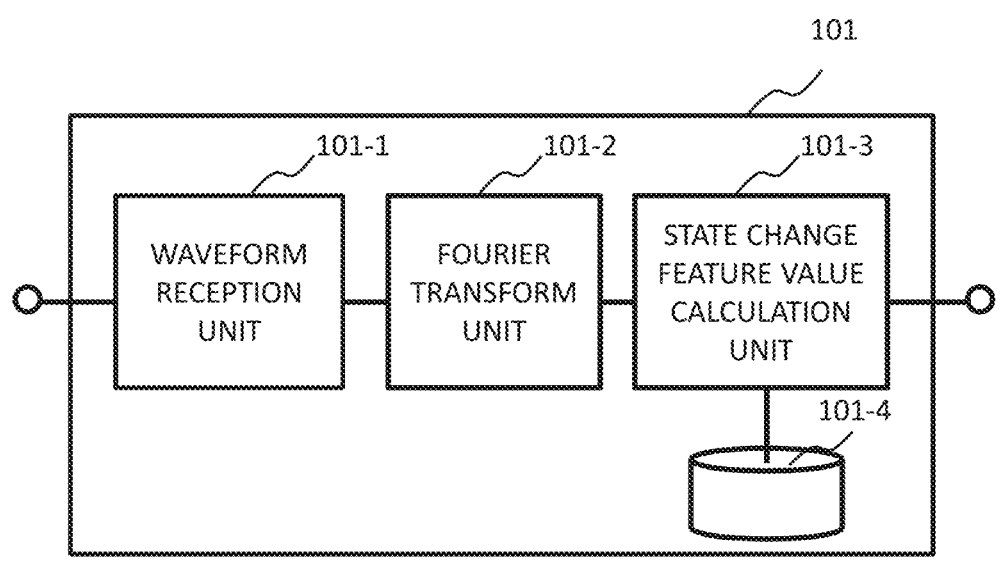
FIG. 5A is a diagram illustrating a configuration of state change feature value extraction unit according to the second example embodiment of the present invention.

FIG. 5A illustrates a configuration of the state change feature value extraction unit (the state change feature value extraction unit) 101 in FIGS. 1 and 3. As illustrated in FIG. 5A, the state change feature value extraction unit 101 includes a waveform reception unit 101-1 that receives current waveform data, a Fourier transform unit 101-2 that performs Fourier transform such as FFT or DFT on the current waveform data (discrete time series data) to convert the current waveform data into data in the frequency domain, and a state change feature value calculation unit 101-3 that calculates a state change feature value from the result of the Fourier transform (a frequency spectrum).

Figure 5B:
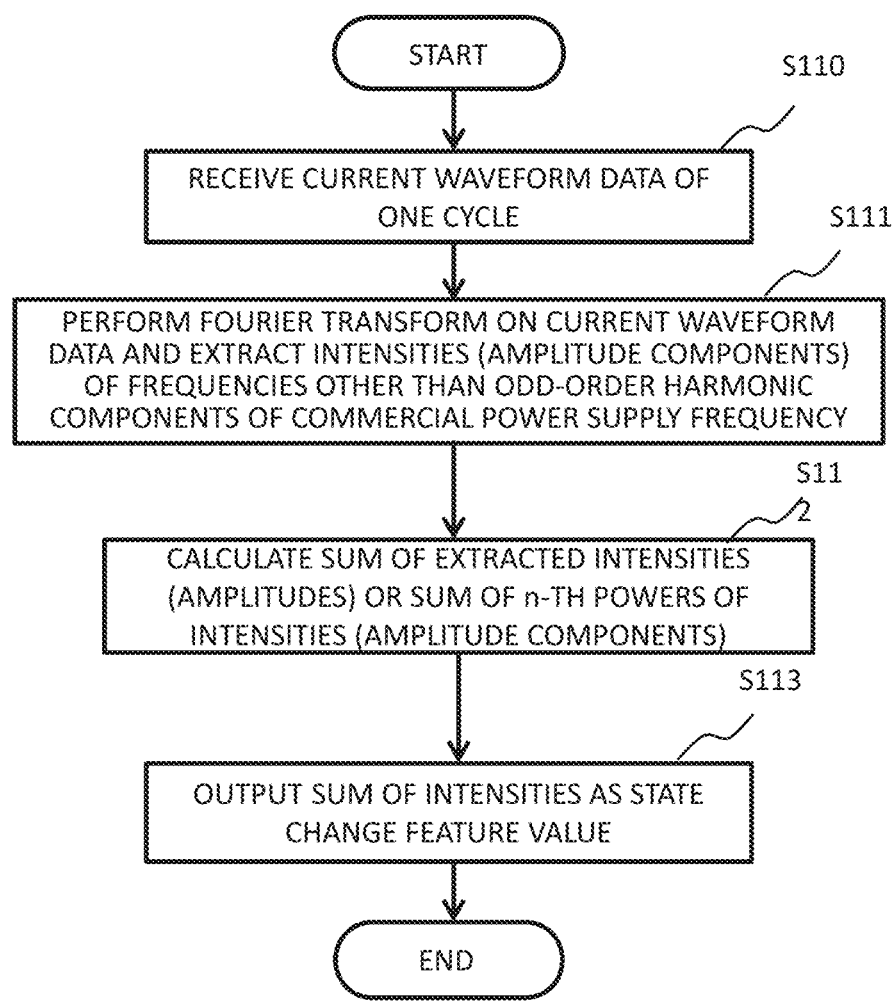
FIG. 5B is a flowchart illustrating an operation of the state change feature value extraction unit according to the second example embodiment of the present invention.

FIG. 5B illustrates processing in step S11 in FIG. 2 performed by the state change feature value extraction unit 101 in FIG. 5A. As illustrated in FIG. 5B, the waveform reception unit 101-1 of the state change feature value extraction unit 101 receives current waveform data of one cycle of the commercial power frequency, for example (step S110). The waveform reception unit 101-1 may receive current waveform data, which is, for example, stored in a storage device in the state change feature value extraction unit 101 or stored in a storage device outside the state change detection apparatus 100. Alternatively, for example, the waveform reception unit 101-1 may receive current waveform data stored in the storage device 103-4 of the waveform acquisition unit 103 in FIG. 24A or 25A. Alternatively, the waveform reception unit 101-1 may directly receive current waveform data from the waveform acquisition unit 103 in FIG. 3.

A length of the data received by the waveform reception unit 101-1 may be one cycle or more of the commercial power frequency. Alternatively, as long as the length enables extraction of the frequency components other than odd-order harmonic components (3rd, 5th, 7th, . . . : 150 Hz, 250 Hz, 350 Hz, . . . ) of the commercial power frequency component (for example, 50 Hz), the length of the data may be one cycle or less of the commercial power frequency. For example, when the 4th-order harmonic component is extracted, the length of the waveform data may be ¼ of one cycle of the commercial power frequency.

Next, the Fourier transform unit 101-2 of the state change feature value extraction unit 101 converts the received current waveform data (time domain data) into frequency domain data by performing, for example, FFT or the like (step S111). The Fourier transform unit 101-2 may extract values of intensity and phase for each frequency component. Alternatively, the Fourier transform unit 101-2 may extract values of intensity and phase of specific frequencies other than odd-order harmonic components of the commercial power frequency. The specific frequencies other than the odd-order harmonic components may include at least one frequency component other than odd-order harmonic components of the commercial power frequency. A sampling frequency fs of the current waveform data acquired by the waveform acquisition unit 103 is set to such a frequency so that a frequency of an upper bound order of a harmonic component to be analyzed is equal to or less than the Nyquist frequency (fs/2). For example, when the Nyquist frequency is the 42nd-order harmonic component (2,100 Hz), the sampling frequency of the measurement instrument (for example, the ADCs 203 and 206 in FIG. 24A) is 4.2 kHz.

The state change feature value calculation unit 101-3 of the state change feature value extraction unit 101 calculates a sum of extracted intensities in a frequency spectrum other than odd-order harmonic components of the commercial power frequency (the above expression (4)) (step S112). The state change feature value calculation unit 101-3 may calculate the sum of the n-th powers of the individual intensities in the frequency spectrum (the above expression (5)).

When calculating the sum of intensities of frequency components other than the odd-order harmonics of the commercial frequency, the state change feature value calculation unit 101-3 may use standard deviation or the like, select the intensities indicating large standard deviation values, and calculate the sum of the selected intensities.

For example, the Fourier transform unit 101-2 may perform short-time Fourier transform in which the Fourier transform unit 101-2 performs Fourier transform while shifting a range in which the time-series current waveform data is extracted with a window function. In this case, by using a standard deviation value calculated along time direction about a frequency value at each time point, the state change feature value calculation unit 101-3 may select frequencies having large standard deviation values in a transition state and calculate a sum of intensities of the selected frequencies.

The state change feature value calculation unit 101-3 outputs the sum of intensities in the frequency spectrum other than the odd-order harmonic components as a state change feature value (step S113). The state change feature value is a feature value which takes a small value when a target section corresponds to a steady state and a large value when a target section corresponds to a state change. The feature value is not limited to the above example. As long as a feature value has this feature, a different feature value may, as a matter of course, be used.

Figure 6A:
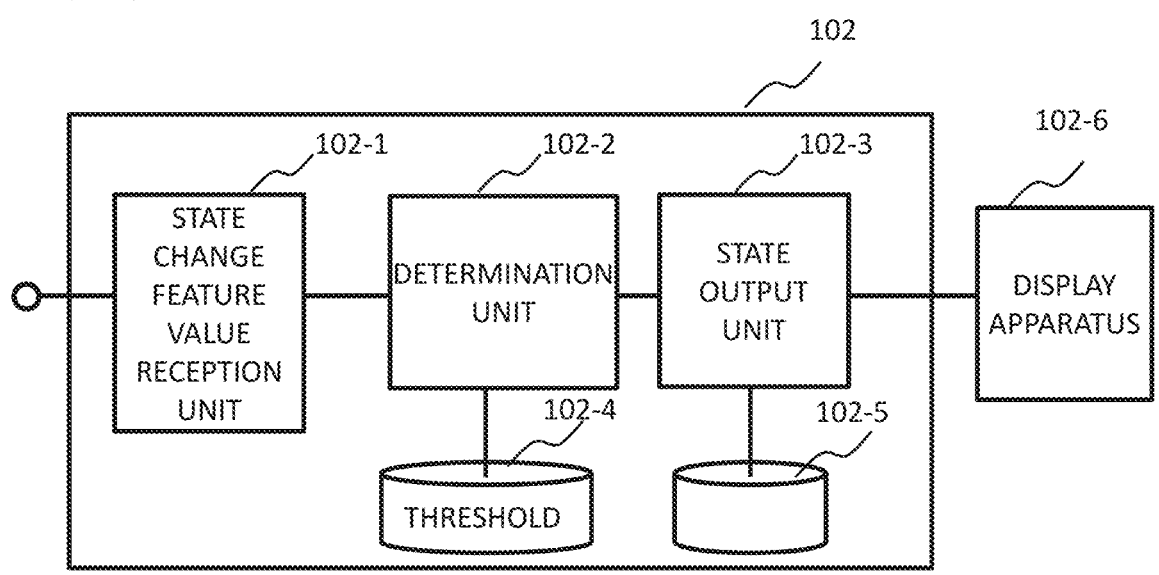
FIG. 6A is a diagram illustrating a configuration of transition state detection unit according to the second example embodiment of the present invention.

FIG. 6A illustrates a configuration of the transition state extraction unit 102 in FIGS. 1 and 3. As illustrated in FIG. 6A, the transition state extraction unit 102 includes a state change feature value reception unit 102-1 that receives state change feature values, a determination unit 102-2 that compares an inputted individual state change feature value with a threshold stored in a storage device 102-4, a state output unit 102-3 that outputs a state based on a determination result obtained by the determination unit 102-2, the storage device 102-4, and a storage device 102-5. A display apparatus 102-6 may be a display apparatus or the like of the computer that constitute the state change detection apparatus 100.

Figure 6B:
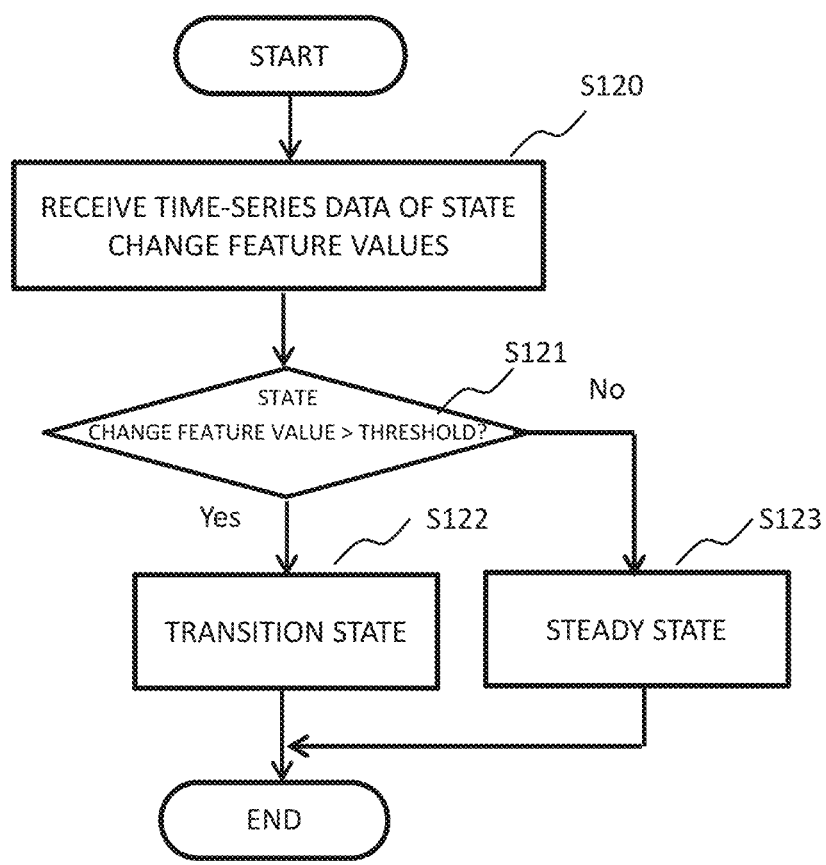
FIG. 6B is a flowchart illustrating an operation of the transition state detection unit according to the second example embodiment of the present invention.

FIG. 6B is a flowchart illustrating processing in step S12 in FIGS. 2 and 4 performed by the transition state extraction unit 102 in FIG. 6A. As illustrated in FIG. 6B, the state change feature value reception unit 102-1 of the transition state extraction unit 102 receives time-series data of state change feature values (step S120).

The determination unit 102-2 of the transition state extraction unit 102 refers to each of the time-series data of state change feature values and determines whether a magnitude of each of the state change feature values is over the threshold stored in the storage device 102-4 (step S121).

When a state change feature value is over the threshold (Yes in step S121), the state output unit 102-3 of the transition state extraction unit 102 outputs the section of the corresponding data of the time-series data of the state change feature values as "transition state" (step S122). When the state change feature value is equal to or less than the threshold (No in step S121), the state output unit 102-3 outputs the section of the corresponding data as "steady state" (step S123). The transition state extraction unit 102 may store, in the storage device 102-5, time-series information about state (steady state or transition state) which is a determination result. Alternatively, the transition state extraction unit 102 may display, on the display apparatus 102-6, time-series information about the state (steady state or transition state) which is the determination result. In this case, the transition state extraction unit 102 may display the state (steady state or transition state) in association with the current waveform data. The threshold stored in the storage device 102-4 may be set in advance by, for example, a user (power consumer), an apparatus designer, a system manager (administrator), or the like from a terminal (not illustrated) or the like and stored in the storage device 102-4. Alternatively, the threshold may be trained by machine learning in which state change feature values of past waveform data are used as explanatory variables and state transition results are used as objective variable, and the threshold stored in the storage device 102-4 may be updated.

Figure 7A:
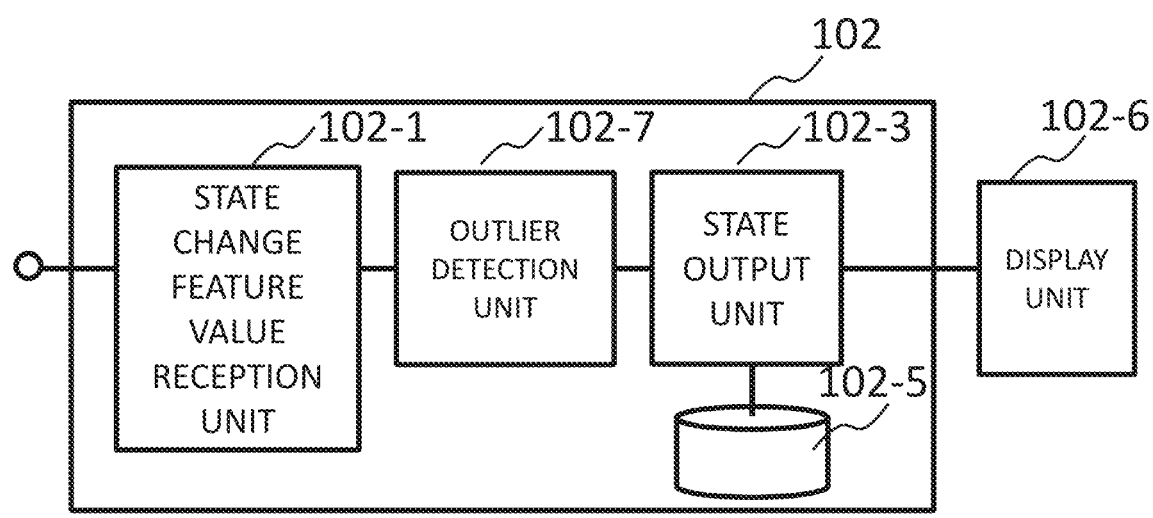
FIG. 7A is a diagram illustrating another configuration of the transition state detection unit according to the second example embodiment of the present invention.

FIG. 7A illustrates another configuration of the transition state extraction unit 102 in FIGS. 1 and 3. As illustrated in FIG. 7A, the transition state extraction unit 102 includes a state change feature value reception unit 102-1 that receives state change feature values, an outlier detection unit 102-7 that detects outliers by statistically analyzing state change feature values, a state output unit 102-3 that outputs a state based on an outlier detection result obtained by the outlier detection unit 102-7, and a storage device 102-5.

Figure 7B:
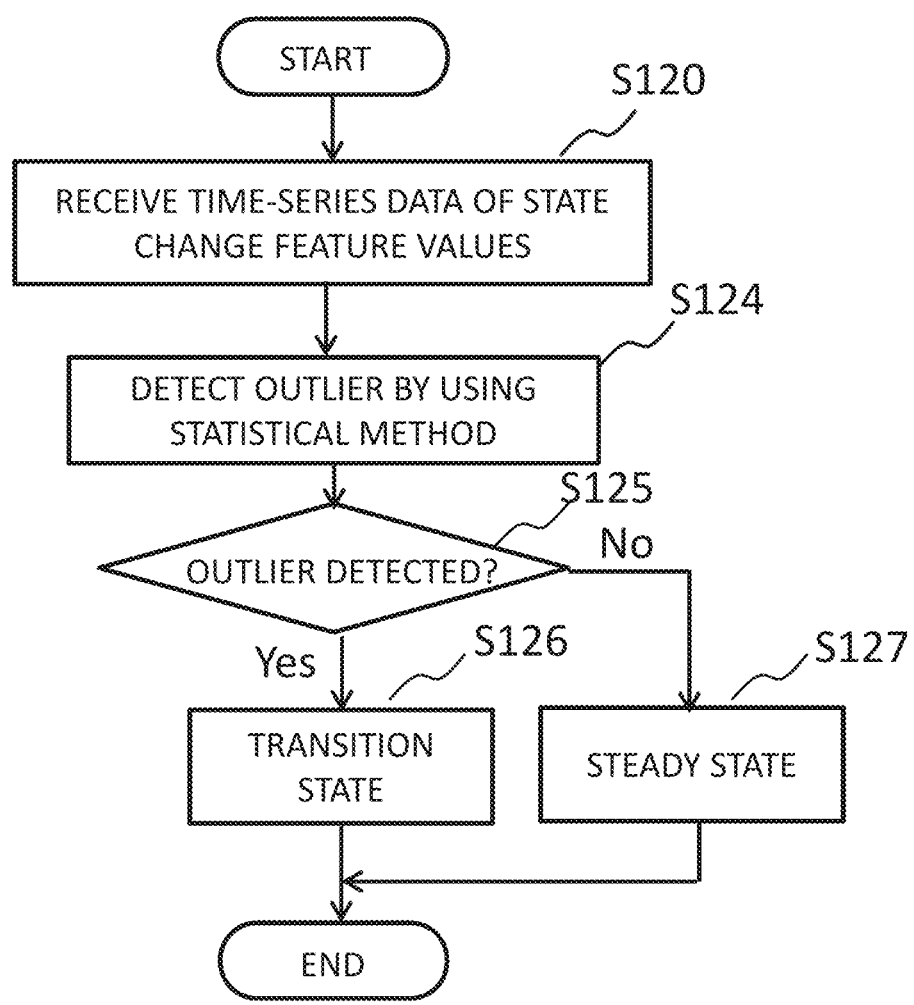
FIG. 7B is a flowchart illustrating another operation of the transition state detection unit according to the second example embodiment of the present invention.

FIG. 7B is a flowchart illustrating processing in step S12 in FIGS. 2 and 4 performed by the transition state extraction unit 102 in FIG. 7A. As illustrated in FIG. 7B, the state change feature value reception unit 102-1 of the transition state extraction unit 102 receives time-series data of state change feature values (step S120).

Among the time-series data of the state change feature values, if a steady state occurs extremely frequently compared with the number of transition states in the time-series data of the acquired current waveform, the outlier detection unit 102-7 of the transition state extraction unit 102 determines that transition states are outliers by using a statistical outlier detection method (step S124). The present configuration uses the time-series data of the state change feature values as advantages. Namely, since a plurality of data is used, the state can be trained from an outlier(s) and set automatically without setting any threshold.

When the outlier detection unit 102-7 detects an outlier(s) (Yes in step S125), the state output unit 102-3 of the transition state extraction unit 102 determines the section of the corresponding data as a transition state (step S126). When the outlier detection unit 102-7 detects no outlier (No in step S125), the state output unit 102-3 determines the section of the corresponding data as a steady state (step S127). The transition state extraction unit 102 may store time-series information about the state (steady state or transition state), which is the determination result, in the storage device 102-5. Alternatively, the transition state extraction unit 102 may display time-series information about the state (steady state or transition state), which is the determination result, on the display apparatus 102-6. In this case, the transition state extraction unit 102 may display the state (steady state or transition state) in association with the current waveform data.

While not limited thereto, the outlier detection method may be for example:

a method using standard deviation or Mahalanobis distance; or a method using Smirnov-Grubbs test (used for testing whether to reject an abnormal value and also referred to as "Smirnov-Grubbs' outlier test"), or the like.

When a condition that a steady state occurs extremely frequently is not satisfied, the technique in FIGS. 7A and 7B cannot be applied. Namely, detection of a transition state by using detection of an outlier cannot be applied, for example, when a current waveform measurement period is long and the measurement condition is not satisfied, or when there are many transition states.

Figure 8A:
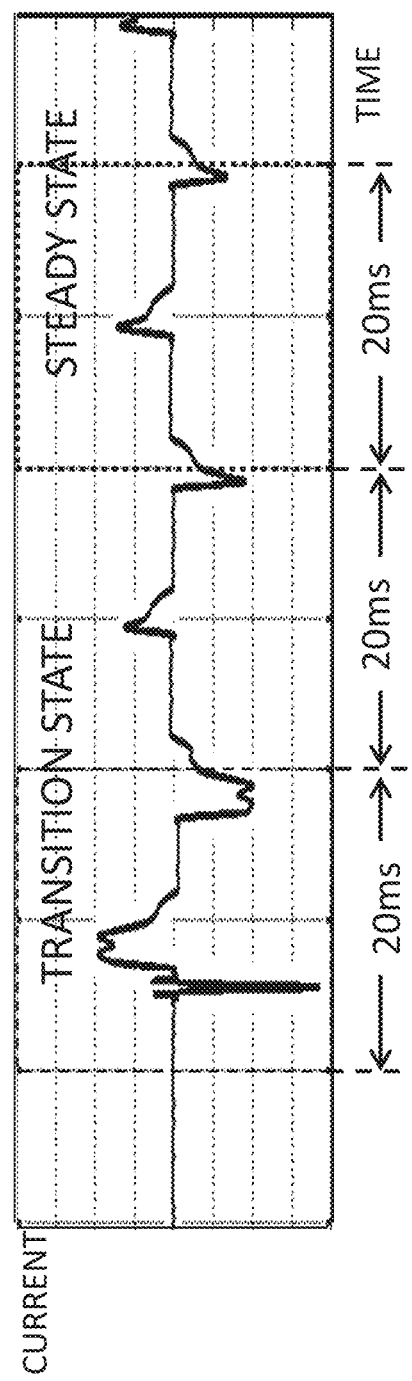
FIG. 8A is a diagram illustrating an example of a current waveform.

FIG. 8A illustrates power supply current waveform data of an electrical device, the data including a time interval corresponding to "transition state" and a time interval corresponding to "steady state". In FIG. 8B, 301 and 302 are frequency spectra (intensities) of "transition state" and "steady state", respectively, of the current waveform data in FIG. 8A, each of the frequency spectra corresponding to one cycle of the commercial power frequency. When the frequency spectra of the transition state 301 and the steady state 302 in FIG. 8B are compared with each other, in the transition state 301, the intensities of components other than odd-order harmonic components of the commercial power frequency (50 Hz) are higher than those in the steady state. In the steady state 302, the odd-order harmonic components such as a third-order harmonic component (150 Hz) and a fifth-order harmonic component (250 Hz) are more significant. In the transition state 301, other than odd-order harmonic components, the intensities of the DC (Direct Current) component and even-order harmonic components such as a 2nd-order harmonic component (100 Hz) and a 4th-order harmonic component (200 Hz) are high. In addition, In the transition state 301, the intensities of high-order harmonic components are higher than those in the steady state.

FIG. 9 illustrates application examples of the state change detection apparatuses 100 and 100A according to the above first and second example embodiments. Specifically, FIG. 9 illustrates an example in which a transition state when a task light is turned on/off are extracted. In FIG. 9, a waveform 311 represents a power supply current waveform data of a task light. A waveform 312 represents temporal change of the state change feature value extracted by performing Fourier transform (FFT) on the power supply current waveform data 311 per one cycle (20 ms) of the commercial power frequency. A waveform 313 represents temporal change of the state change feature value extracted by performing short-time Fourier transform on the current waveform 311 while shifting time. In FIG. 9, 314 represents a transition state detected by using the state change feature value (temporal change of the transition state). In FIG. 9, the same time axis is used in 311 to 314. For example, when a first half cycle of a measured current waveform significantly differs from a second half cycle, a value of a state change feature value becomes large. By setting a threshold for the state change feature value, a transition state can be detected.

In FIG. 9, in 312, the state change feature value keeps a constant value in a time interval (section) of one cycle (20 ms) of the power supply frequency (thus, a time resolution is 20 ms).

In FIG. 9, in 313, the Fourier transform unit 101-2 performs short-time Fourier transform while shifting, by Δt (for example, 1 ms), a start point of a range in which the state change feature value is extracted by the window function (length=20 ms). Thus, a time resolution of the state change feature value is Δt (=1 ms) (a staircase waveform having a unit width of 1 ms). Thus, in 313, a temporal change of the state change feature value can be extracted accurately. In contrast, in 312, since the state change feature value is kept constant during one cycle (20 ms) of the commercial power frequency, the temporal change near the peak of the state change feature value represented by 313 is not detected.

In FIG. 9, the transition state extraction unit 102 of the state change detection apparatuses 100 and 100A, according to the first and second example embodiments, compares a magnitude of an individual state change feature value 313 obtained based on, for example, short-time Fourier transform, with a threshold. If the magnitude of a state change feature value is equal to or less than the threshold, the transition state extraction unit 102 determines that the corresponding section corresponds to the steady state. If the magnitude of the state change feature value is over the threshold, the transition state extraction unit 102 determines that the corresponding section corresponds to the transition state. Of all the current waveform data 311, a section (time window length=20 ms) corresponding to a state change feature value whose magnitude is equal to or less than the threshold is determined as the steady state. A section corresponding to a state change feature value whose magnitude is over the threshold is determined as the transition state. In the example represented by 314 in FIG. 9, the state has changed at a point of 20 ms from a steady state to a transition state and changed at a point of 60 ms from the transition state back to a steady state.

In the example represented by 314 in FIG. 9, while the state change feature values 312 and 313 have different time resolutions, "transition state" has been detected at the same sections. This is because the current waveform 311 happens to have such a pattern. Generally, when the state change feature values have different time resolutions, the transition state detection results show different temporal change patterns.

Figure 10:
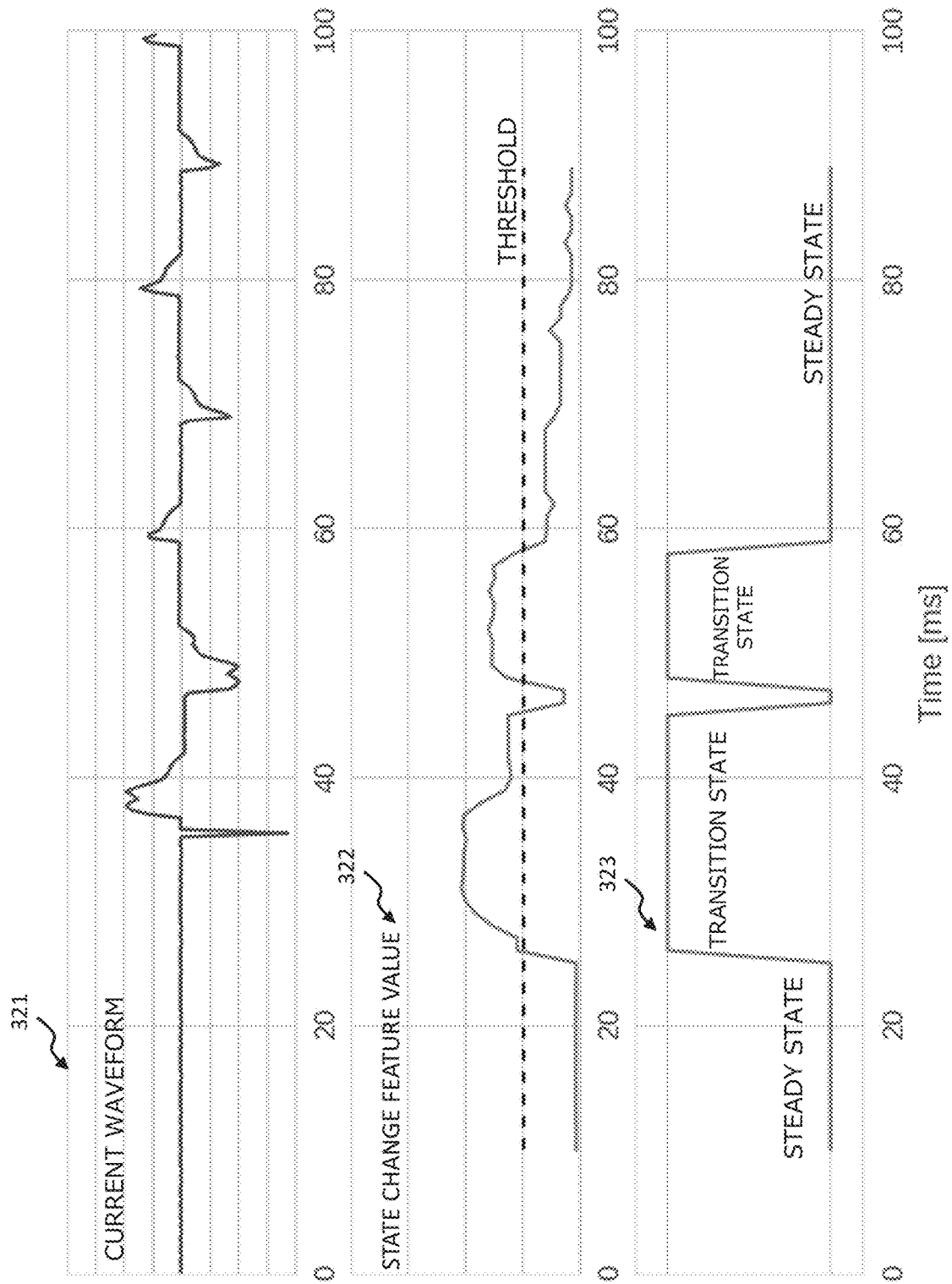
FIG. 10 is a diagram illustrating a current waveform, transition of a state change feature value, and a transition state detection result.

In FIG. 10, 321 represents power supply current waveform data of an electrical device (the same data as that in FIG. 8A), 322 represents a corresponding state change feature value, and 323 represents examples of a transition state. In FIG. 10, 322 represents temporal change (time-series data) of the state change feature value obtained by performing frequency analysis using short-time Fourier transform in which the window function (window) with which the current waveform data 321 is multiplied is 20 ms (one cycle of the commercial power frequency). In addition, 323 represents temporal change of a steady state and a transition state calculated by comparing the time-series data of the state change feature value with a threshold.

Figure 11B:
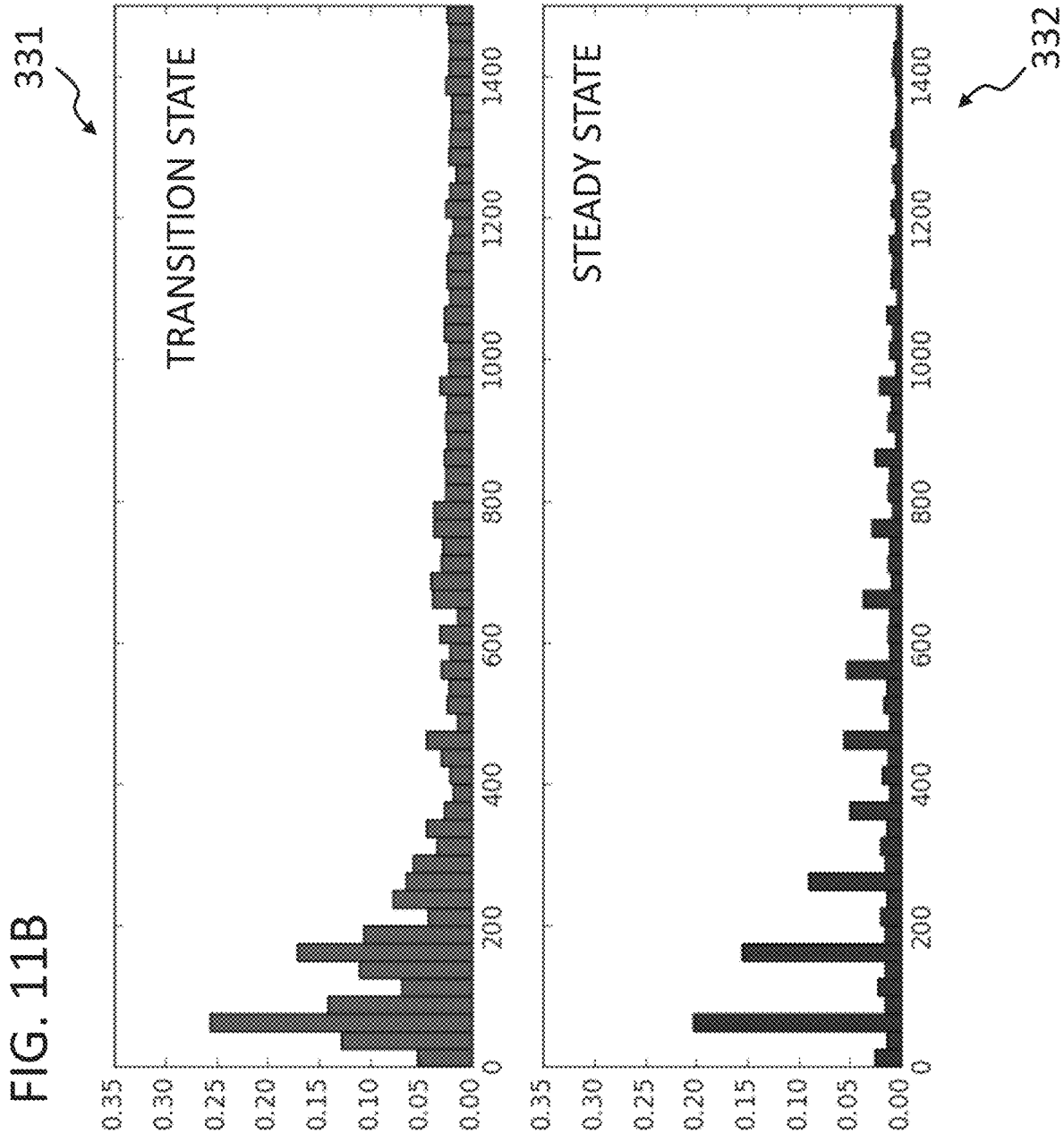
FIG. 11B is a diagram illustrating a frequency spectrum in two cycles (a transition state) and a frequency spectrum in two cycles (a steady state) in FIG. 11A.

FIG. 11A depicts power supply current waveform data of an electrical device. In FIG. 11B, 331 depicts a frequency spectrum of the "transition state" in FIG. 11A (a time interval of two cycles of the power supply frequency=40 ms) and 332 depicts a frequency spectrum of the "steady state" in FIG. 11A (a time interval of two cycles of the power supply frequency). In the frequency spectra in FIG. 11B, the following frequency resolution Δf is given as follows:

$$\Delta f = 1/T = fs/N \qquad (6)$$

(wherein T is a length of the window function, fs is a sampling frequency, and

N is a sampling number). The length (=40 ms) of the window function in FIG. 11A is twice the length (=20 ms) of the window function in FIG. 8A. If the same sampling frequency is set, the sampling number in FIG. 11A is twice the sampling number in FIG. 8A. Thus, as represented by 331 and 332 in FIG. 11B, the frequency resolution by FFT is twice that represented by 301 and 302 in FIG. 8B.

In FIG. 12, 341 represents power supply current waveform data of an electrical device (the same data as 321 in FIG. 10A). In FIG. 12, 342 represents time-series data of the state change feature value obtained by performing frequency analysis using short-time Fourier transform in which FFT is performed by shifting a window function. A length of a window function with which the power supply current waveform data 341 is multiplied is 40 ms (two cycles). In FIG. 12, 343 represents temporal change of a steady state and a transition state calculated by comparing the state change feature value with a threshold.

As depicted by 342 in FIG. 12, the temporal change of the state change feature values, each calculated for the current waveform data of a section of two cycles of the commercial power frequency (the length of the window function=40 ms), somewhat differs from the temporal change (322 in FIG. 10) of the state change feature values, each calculated for the current waveform data of a section of one cycle of the commercial power frequency (the length of the window function=20 ms). As represented by 322 in FIG. 10, after the state change feature value falls below the threshold for a short time (a few milliseconds) between 40 ms and 50 ms, the state change feature value exceeds the threshold again. Subsequently, before 60 ms, the state change feature value drops and falls below the threshold again. In FIG. 12, as represented by 342, the state change feature value is always above the threshold from 20 ms until it falls below the threshold at a time point before 70 ms. A glitch-like pulse (an instantaneous steady state between transition states) between 40 ms and 50 ms detected as represented by 323 in FIG. 10 is not detected in 343 in FIG. 12. Instead, this section is constantly determined to correspond to the transition state from 20 ms to the time point before 70 ms. The transition state represented by 343 in FIG. 12 corresponds to a single transition state obtained by concatenating two neighboring transition states in 323 in FIG. 10.

Figure 26:
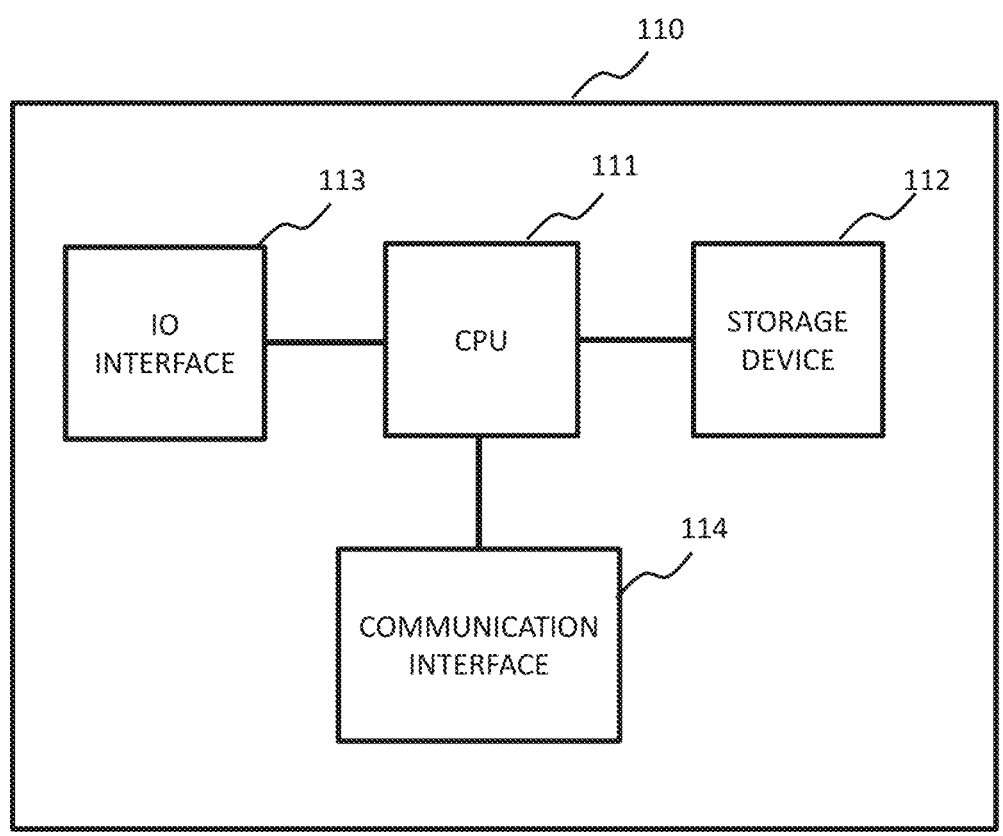
FIG. 26 is a diagram illustrating a configuration in which a state change detection apparatus is implemented on a computer.

A program executed by a computer may realize processing and functions of an individual one of the state change feature value extraction unit 101 and the transition state extraction unit 102 in FIG. 1 and the waveform acquisition unit 103, the state change feature value extraction unit 101, and the transition state extraction unit 102 in FIG. 3. FIG. 26 illustrates a configuration in which the state change detection apparatus 100 in FIG. 1 or the state change detection apparatus 100A in FIG. 3 is realized by a computer apparatus 110. As illustrated in FIG. 26, the computer apparatus 110 includes a CPU (Central Processing Unit) 111, a memory (storage device) 112, an Input-Output (TO) interface 113, and a communication interface 114. The storage device 112 may be any one of a hard disk drive (HDD), a semiconductor memory (for example, a solid state drive (SSD), a dynamic random access memory (DRAM), a static random access memory (SRAM), a read-only memory (ROM), an electrically erasable programmable read-only memory), a compact disc (CD), and a digital versatile disc (DVD). Alternatively, the storage device 112 may be a combination of at least two of the above plurality of storage devices. The storage device 112 holds a program(s) executed by the CPU 111. The CPU 111 executes a program(s) stored in the storage device 112 to realize a function(s) of the state change feature value extraction unit 101 and the transition state extraction unit 102 in FIG. 1 or the waveform acquisition unit 103, the state change feature value extraction unit 101, and the transition state extraction unit 102 in FIG. 3. The transition state extraction unit 101 may output a state transition extraction result to an output apparatus via the IO interface 113. The waveform acquisition unit 103 in FIG. 3 may acquire current waveforms from a measurement instrument or the like via the communication interface 114 and store the acquired current waveforms in the storage device 112 (examples of which include a writable HDD, SSD, and DRAM). In this case, the communication interface 114 corresponds to the communication unit 103-1 in FIGS. 24A and 25A. The storage device 112 may correspond to the storage device 103-4 in FIGS. 24A and 25A. The storage device 101-4 in FIG. 5A, the storage devices 102-4 and 102-5 in FIG. 6A, and the storage device 102-5 in FIG. 7A may be combined as the storage device 112 of the computer apparatus 110 along with the storage device 103-4 in FIGS. 24A and 25A.

According to the above first and second example embodiments, an individual state change feature value is calculated by extracting harmonic components other than odd-order harmonic components from current waveform data, and transition of a state is detected based on a magnitude of the individual state change feature value. Thus, a transition of a state can be detected accurately.

There is a case wherein simple observation of whether a power supply current waveform such as those in FIGS. 8A and 10A has a spike or not, could not determine whether a state is a transition state or a steady state. Depending on a timing at which a switch of the electrical device changes, there is a case in which the power supply current waveform does not change sharply. For example, when the power supply current waveform represents a zero-crossing point, if the switch changes from on to off, the power supply current waveform does not change sharply. Thus, the power supply current waveform needs to be monitored constantly. In contrast, according to the first and second example embodiments, based on a magnitude (non-negative value) of a state change feature value of the power supply current waveform, it is possible to detect whether a state is a transition state or a steady state.

Third Example Embodiment

Figure 13:
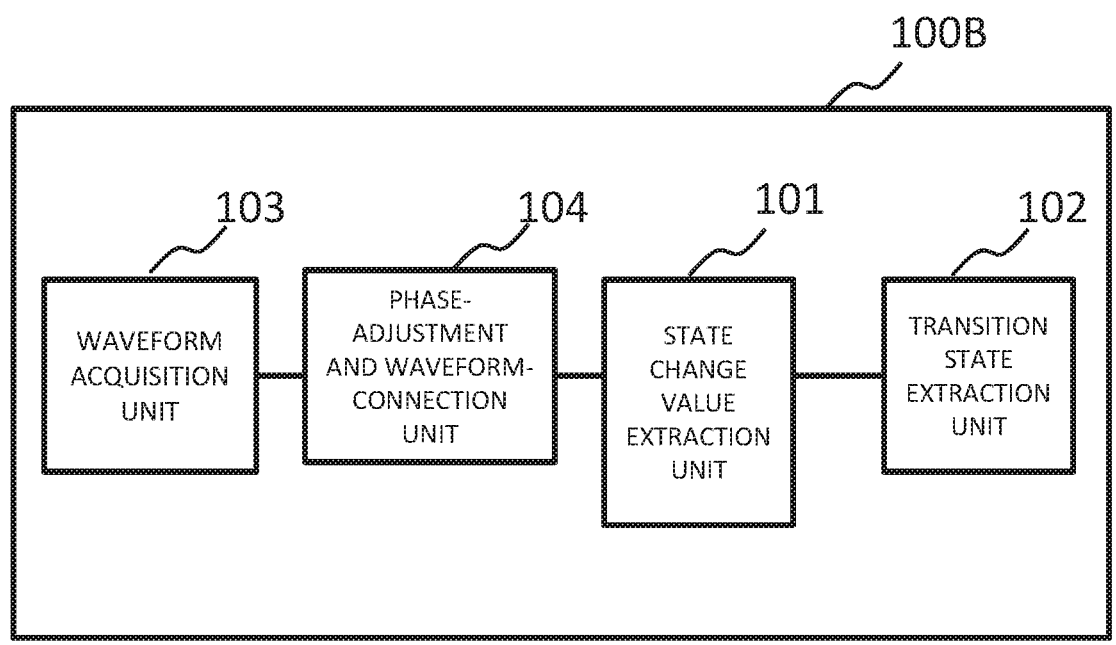
FIG. 13 is a diagram illustrating a configuration according to a third example embodiment of the present invention.

Next, a third example embodiment of the present invention will be described in detail with reference to drawings. According to the third example embodiment, a connection waveform obtained by concatenating a plurality of power supply current waveform data, each corresponding of one cycle of a commercial power frequency, is converted into data in a frequency domain, and a sum of intensities of frequency components other than odd-order harmonic components (or n-th powers of individual intensities) is used as a state change feature value. FIG. 13 illustrates a configuration according to the third example embodiment of the present invention.

As illustrated in FIG. 13, a state change detection apparatus 100B according to the third example embodiment includes a waveform acquisition unit 103, a phase-adjustment and waveform-connection unit 104, a state change feature value extraction unit 101, and a transition state extraction unit 102.

In FIG. 13, the state change feature value extraction unit 101 and the transition state extraction unit 102 detect transition of a state, as in the first and second example embodiments.

The waveform acquisition unit 103 acquires, for example, a current waveform and a voltage waveform of one cycle of a commercial power frequency. The phase-adjustment and waveform-connection unit 104 adjusts phases of instantaneous current waveforms or instantaneous power waveforms at a plurality of measurement points temporally apart by one cycle or more of the commercial power frequency to concatenate the phase adjusted waveforms.

The state change feature value extraction unit 101 performs Fourier transform on the concatenated instantaneous current waveforms or instantaneous power waveforms and outputs a of intensities of frequency components other than odd-order harmonic components of the commercial power frequency as a state change feature value.

Figure 14A:
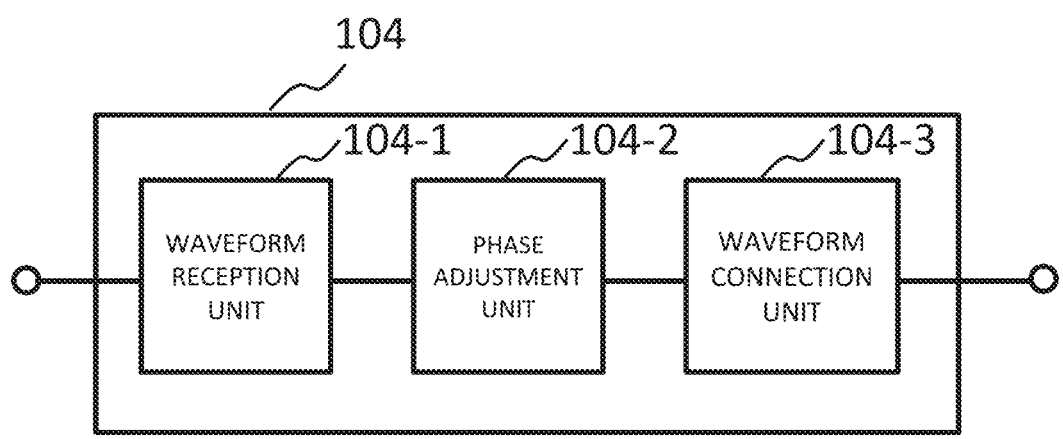
FIG. 14A is a diagram illustrating a configuration of phase-adjustment and waveform-connection unit according to the third example embodiment of the present invention.
Figure 14B:
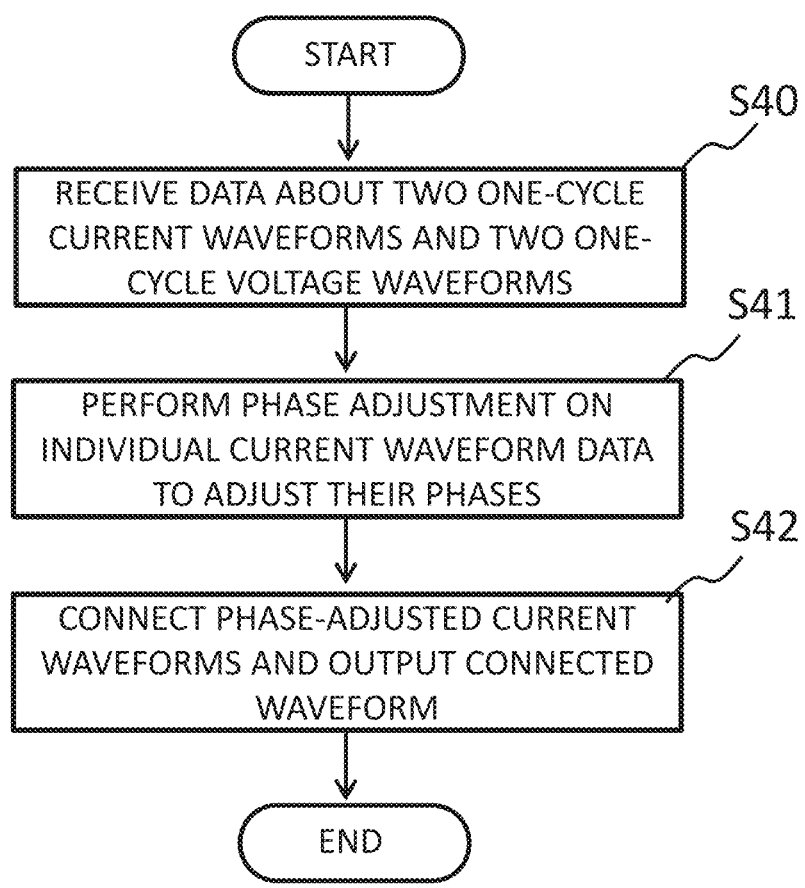
FIG. 14B is a flowchart illustrating an operation of the phase-adjustment and waveform-connection unit according to the third example embodiment of the present invention.

FIG. 14A illustrates a configuration of the phase-adjustment and waveform-connection unit 104. FIG. 14B is a flowchart illustrating an operation of the phase-adjustment and waveform-connection unit 104. Since the waveform acquisition unit 103, the state change feature value extraction unit 101, and the transition state extraction unit 102 operate in the same way as those according to the first example embodiment, description thereof will be omitted.

As illustrated in FIG. 14A, the phase-adjustment and waveform-connection unit 104 includes a waveform reception unit 104-1 that receives data about two one-cycle current waveforms and two one-cycle voltage waveforms, a phase adjustment unit 104-2 that causes phases of the two current waveforms to be aligned with each other, by performing phase adjustment on the current waveform data, and a waveform connection unit 104-3 that concatenates the current waveforms that have phases aligned with each other.

As illustrated in FIG. 14B, for example, the waveform reception unit 104-1 of the phase-adjustment and waveform-connection unit 104 receives, from the current waveform data and voltage waveform data acquired by the waveform acquisition unit 103, a plurality of voltage waveform data and a plurality of current waveform data measured during a plurality of data acquisition periods. For example, the waveform reception unit 104-1 receives current waveform data of one cycle and voltage waveform data of one cycle at an individual one of two data acquisition timings which are adjacent in time series, to each other (step S40).

If phases of the received two power supply current waveform data are not aligned (thus, if phase adjustment is needed), the phase adjustment unit 104-2 of the phase-adjustment and waveform-connection unit 104 performs phase adjustment (step S41).

As an example of the phase adjustment method, the phase adjustment unit 104-2 may perform Fourier transform to extract a phase of a reference wave (fundamental wave) of a commercial power frequency from a voltage waveform and adjust the phase of a current waveform by using the phase of the reference wave.

As another example of the method for extracting phase information from a voltage waveform, the phase adjustment unit 104-2 may use a method in which a zero-crossing point of the voltage waveform is detected. The phase adjustment unit 104-2 may extract phase information about a voltage waveform, based on information indicating what number is a first zero-crossing point of the voltage waveform from a sampling start point of the voltage waveform data and the number of data points from the first zero-crossing point to a next zero cross point. When the first zero-crossing point is a m-th point from the sampling start point and the number of data points from the first zero cross point to the next zero-crossing point is n (a phase between the zero-crossing points is 180 degrees), the phase is given by 180×m/n.

Regarding the phase adjustment of the power supply current waveform data, the phase adjustment unit 104-2 may perform phase rotation after converting the power supply current waveform data into data in a frequency domain by Fourier transform. Alternatively, the extracted phase may be converted into a phase having a length of one cycle (360 degrees) of the commercial power frequency, and the current waveform data may be shifted by the corresponding phase in a time domain.

If phases of the power supply current waveform data have already been adjusted, for example, by adjusting a start point of the power supply current waveform by using the value of a zero-crossing point of a voltage or trigger timing inside a measurement instrument at a time of measurement of the power supply voltage and the power supply current, the waveform reception unit 104-1 of the phase-adjustment and waveform-connection unit 104 may not need to receive any voltage waveforms. In this case, since the phase-adjustment and waveform-connection unit 104 does not use any voltage waveforms, the waveform acquisition unit 103 may acquire only the power supply current waveform data.

The waveform connection unit 104-3 of the phase-adjustment and waveform-connection unit 104 concatenates, two current waveform data, neighboring in time series, with phases adjusted by the phase adjustment unit 104-2, as continuous values in times series, and outputs the resultant waveform data (step S42).

According to the third example embodiment, by using the method as in the first and second example embodiments, transition of the state is detected. As in the method according to the first example embodiment, the state change feature value extraction unit 101 extracts a state change feature value by summing intensities of frequency components other than odd-order harmonic components of a reference wave of the commercial power frequency (for example, 50 Hz) from a current waveform (for example, the length is 40 ms) obtained by connecting two current waveforms and outputted by the phase-adjustment and waveform-connection unit 104. As described with reference to FIG. 6, by comparing the state change feature value with the threshold, the transition state extraction unit 102 may detect a transition state. Alternatively, as described with reference to FIG. 7 the transition state extraction unit 102 may detect a transition state by detecting an outlier based using a statistical method.

The method for causing the waveform connection unit 104-3 of the phase-adjustment and waveform-connection unit 104 in FIG. 14A to concatenate two current waveform data is not of course limited to the above method. For example, a first half of a temporally previous current waveform and a second half of a temporally subsequent current waveform may be concatenated to each other to create one cycle of a current waveform in total.

The number of current waveforms concatenated by the waveform connection unit 104-3 of the phase-adjustment and waveform-connection unit 104 is not limited to two. The phase-adjustment and waveform-connection unit 104 may adjust and align phases of three or more current waveforms, perform Fourier transform, and calculate a sum of intensities of frequency components other than odd-order harmonic components.

In addition, as another connection method performed by the waveform connection unit 104-3 of the phase-adjustment and waveform-connection unit 104, the phase-adjustment and waveform-connection unit 104 may temporally (in time series) and alternately arrange two current waveforms with phases thereof aligned, to create one cycle of a current waveform in total. In this case, if Fourier transform is performed on a created one cycle current waveform, no harmonics other than odd-order harmonic components of the commercial power frequency appear. However, when two temporally previous and subsequent current waveforms differ, intensities of a higher frequency side of odd-order harmonic components are increased. Thus, a transition state may be detected by setting a threshold for intensities of higher-frequency-side odd-order harmonics.

As another connection method performed by the waveform connection unit 104-3 of the phase-adjustment and waveform-connection unit 104, a new one cycle current waveform may be created by randomly selecting and aligning instantaneous current values of two synchronized current waveforms. When Fourier transform is performed on an obtained current waveform, if no change is seen in the two current waveforms, only odd-order harmonics are obtained. If a change is seen in the two current waveforms, a value of a sum of harmonics other than odd-order harmonic components or a value of harmonics of odd-order higher frequencies are increased. A transition state may be detected by setting a threshold for these values. The phase-adjustment and waveform-connection unit 104 uses a waveform data sampling value already stored. Without shortening an acquisition interval (sampling time) to acquire waveform data at a high sampling rate, insufficiency of existing waveform data (for example, waveform data in no measurement period) can be interpolated. Thus, state estimation can be performed accurately.

Figure 15:
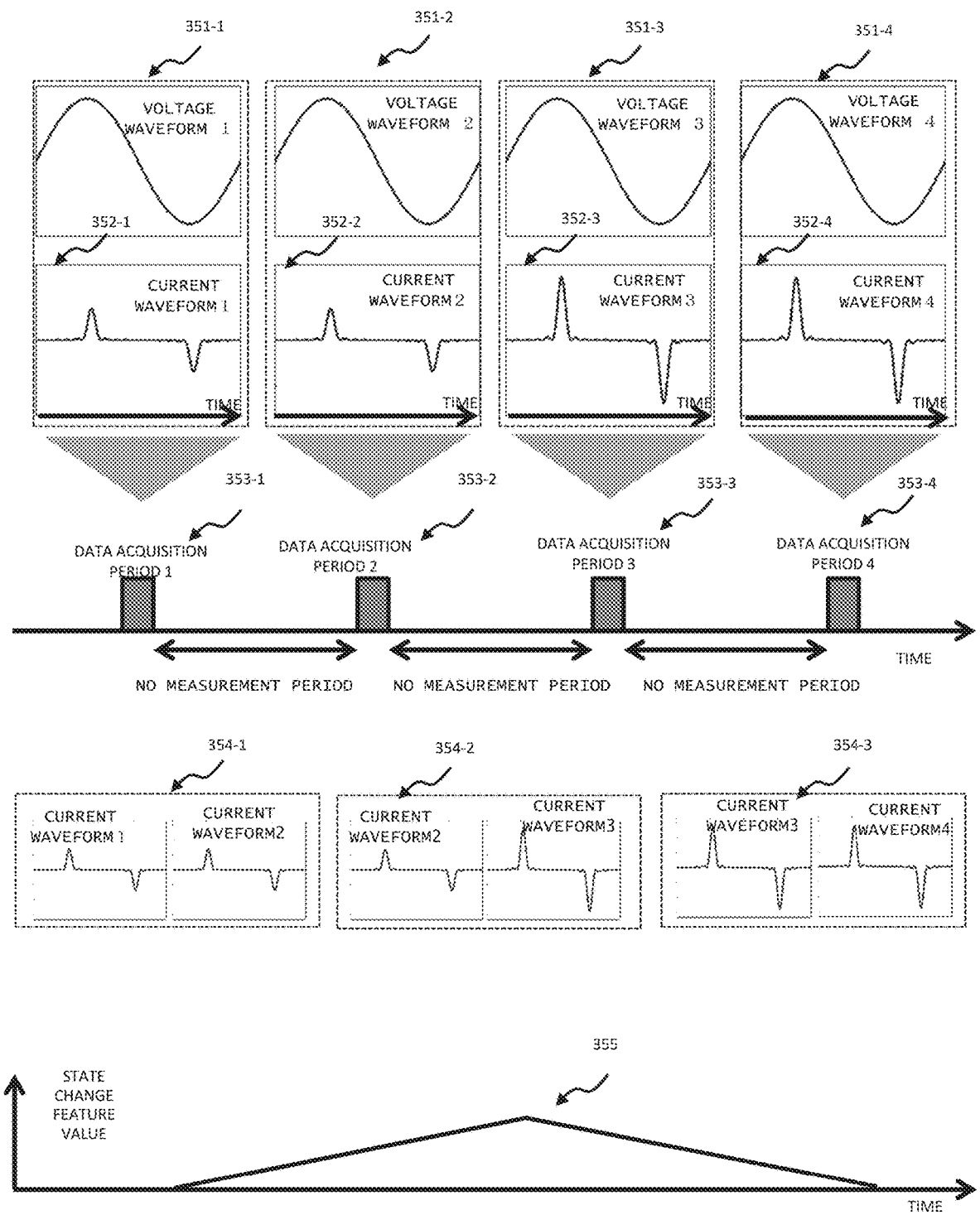
FIG. 15 illustrates voltage waveforms, current waveforms, data acquisition periods, examples of how two waveforms whose phases have been adjusted by the phase-adjustment and waveform-connection unit are connected by the phase-adjustment and waveform-connection unit, and temporal change of a state change feature value according to the third example embodiment of the present invention.

FIG. 15 schematically illustrates phase-adjusted voltage waveforms (351-1 to 351-4) and current waveforms (352-1 to 352-4) arranged in the order of measurement. FIG. 15 also illustrates four acquisition periods (data acquisition periods 1 to 4 (353-1 to 353-4)) in which the voltage waveform and current waveform data ((351-1, 352-1) to (351-4, 352-4)) are acquired, and there is "no measurement period" between two acquisition periods.

In FIG. 15, in each of the data acquisition periods 1 to 4 (353-1 to 353-4), for example, one cycle of a voltage waveform and one cycle of a current waveform are acquired ((a voltage waveform 1, a current waveform 1) to (a voltage waveform 4, a current waveform 4)).

In FIG. 15, 354-1 illustrates a state in which two waveforms of phase-adjusted current waveforms 1 and 2 are concatenated. Likewise, 354-2 illustrates a state in which two waveforms of the current waveforms 2 and 3 are concatenated. Likewise, 354-3 illustrates a state in which two waveforms of the current waveforms 3 and 4 are concatenated.

In FIG. 15, 355 depicts temporal change of a state change feature value calculated by short-time Fourier transform on each pair of concatenated waveforms, namely, on the current waveforms 1 and 2, the current waveforms 2 and 3, and the current waveforms 3 and 4. In this short-time Fourier transform, the extraction range in which Fourier transform is performed is gradually shifted by multiplying a window function of a length of 40 ms (corresponding to two cycles of the power supply frequency).

Hereinafter, connection examples of two phase-adjusted one-cycle current waveforms will be described. The following description assumes that two phase-adjusted one-cycle current waveforms (the waveforms 1 and 2) are arranged as the following data.

Waveform 1: AAAAA AAAAA
Waveform 2: BBBBB BBBBB (1) Two Waveforms are Concatenated with Cycles Being Aligned.

A two-cycle waveform is created by using the waveform 1 as a first cycle and the waveform 2 as a second cycle.

Example: AAAAA AAAAA BBBBB BBBBB (2) Two Waveforms are are Concatenated Per Half Cycle with Cycles Being Aligned.

A one-cycle waveform is created by using the waveform 1 as a first half of one cycle and the waveform 2 as a second half of this one cycle.

Example: AAAAA BBBBB (3) Two Waveforms are Alternately Arranged with Cycles Being Aligned.

A waveform is created by arranging as for odd-numbered data points and Bs for even-numbered data points. For example, the waveform 1 is used for a data point 1, the waveform 2 is used for a data point 2, and the waveform 1 is used for a data point 3. As may be arranged for even-numbered data points and Bs may be arranged for the odd-numbered data points. In this case, while no components other than odd-order harmonic components appear, if there is a change, intensities of higher frequencies become high.

Example: ABABA BABAB ABABA BABAB (4) Two Waveforms are Randomly Arranged with Cycles Being Aligned.

As are arranged for half of a total data number of a one-cycle waveform, and Bs are arranged for the other half. Selection of the waveform data A or B may be determined randomly.

Example: AABAB BABBA

Figure 16:
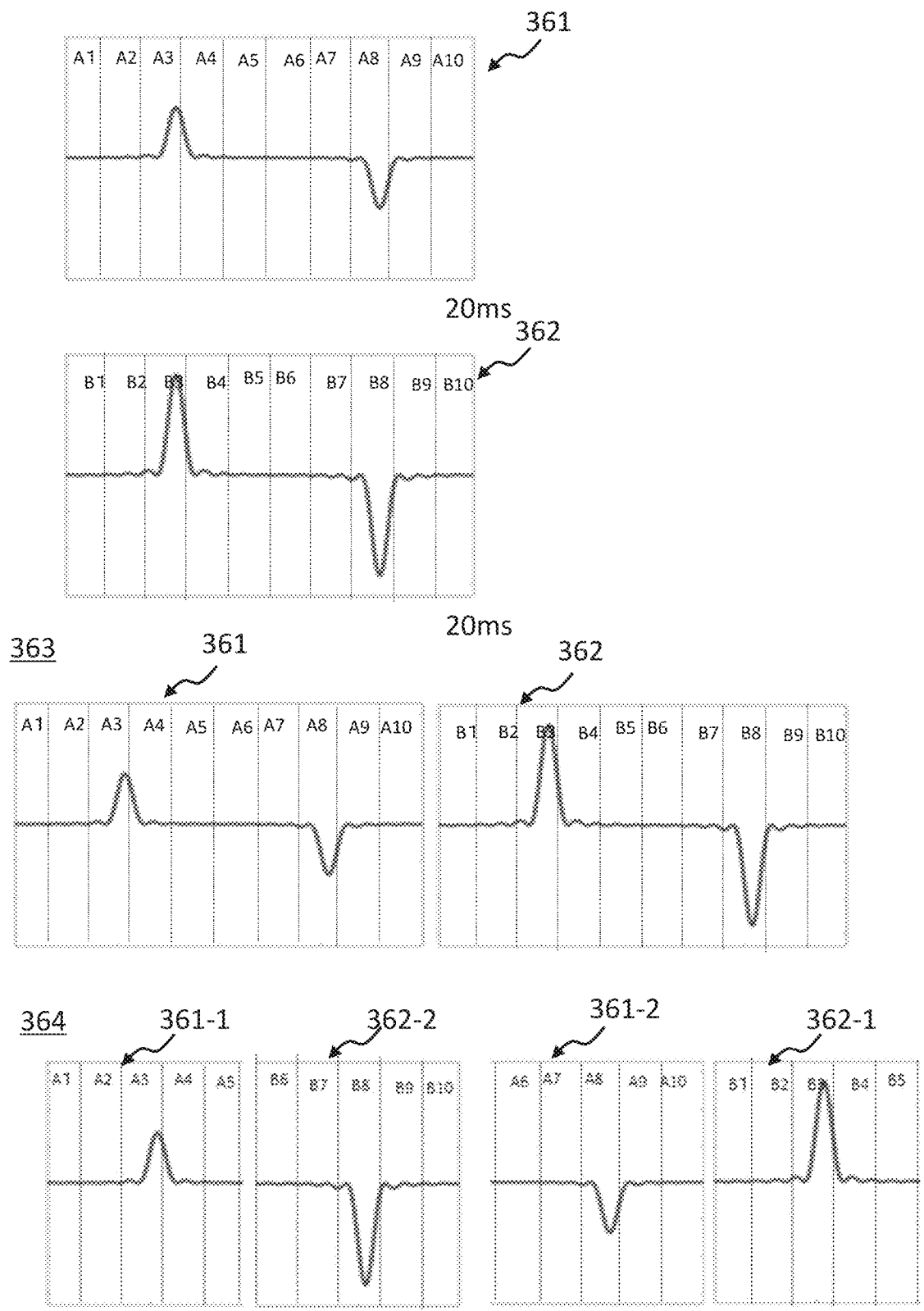
FIG. 16 illustrates examples of how two waveforms are connected according to the third example embodiment of the present invention.

FIG. 16 illustrates examples of how two phase-adjusted one-cycle (20 ms) current waveforms are connected. In FIGS. 16, 361 and 362 represent waveforms 1 and 2, respectively.

waveform 1: data of A1 to A10 are arranged in this order.
waveform 2: data of B1 to B10 are arranged in this order.

In FIG. 16, 363 represents an example in which a two-cycle waveform is created by arranging the waveform 1 (361) as a first one cycle and the waveform 2 (362) as a second one cycle. This corresponds to how two waveforms are concatenated (354-1 to 354-3) in FIG. 15.

In FIG. 16, 364 represents an example of creating a one-cycle waveform by arranging the waveform 1 as a first half of a one cycle and the waveform 2 as a second half of the one cycle. As represented by 364, in a first one-cycle waveform, the data A1 to A5 (361-1) of the waveform 1 is arranged as the first half, and the data B6 to B10 (362-2) of the waveform 2 is arranged as the second half. In a second one-cycle waveform, the data A6 to A10 (361-2) of the waveform 1 is arranged for the first half, and the data B1 to B5 (362-1) of the waveform 2 is arranged for the second half.

According to the third example embodiment, as in the first example embodiment described with reference to FIG. 26, the unit of the state change detection apparatus 100B may of course be realized by a program executed by a computer.

According to the third example embodiment, since two current waveforms that are neighboring in time series can be compared with each other in the same method as that according to the first example embodiment, even when data cannot continuously be measured because of performance of an apparatus or the like, a state transition can be detected by using harmonics other than odd-order harmonic components. A sampling period of a power supply current based on a HEMS is 100 msec (a time interval corresponding to five cycles of a commercial power frequency), and measurement is performed every 10 seconds. In this case, even when a state changes from a steady state to a transition state in a no measurement period, the third example embodiment enables estimation of a transition state.

When the waveform reception unit 104-1 of the phase-adjustment and waveform-connection unit 104 receives one-cycle current waveform data and one-cycle voltage waveform data acquired at temporally neighboring two data acquisition timings from a plurality of voltage waveform data and current waveform data (for example, (the voltage waveform 1, the current waveform 1) to (the voltage waveform 4, the current waveform 4) in FIG. 15) measured in a plurality of data acquisition periods, the data being stored in advance in a storage device inside or outside the state change detection apparatus 100B, the waveform acquisition unit 103 may not be included in the state change detection apparatus 100B.

Fourth Example Embodiment

Figure 17:
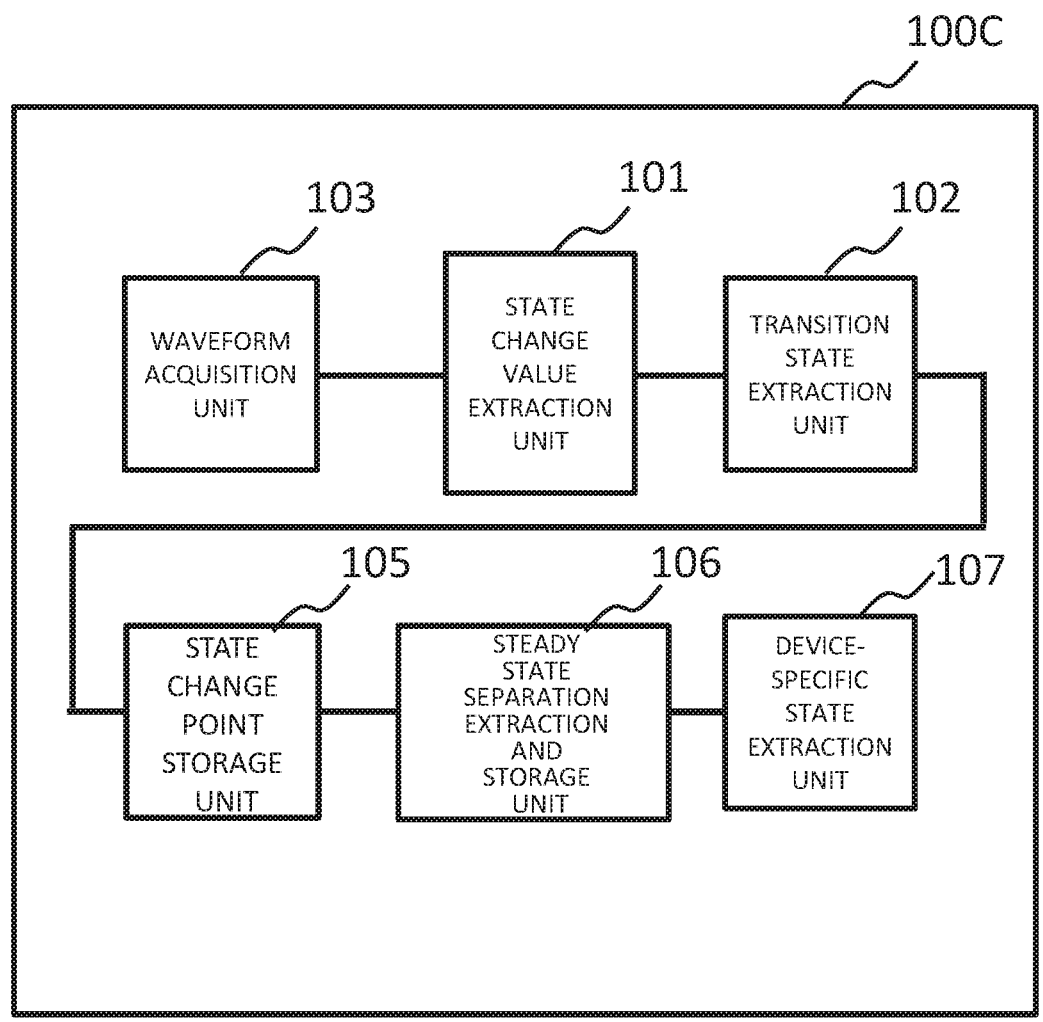
FIG. 17 is a diagram illustrating a configuration according to a fourth example embodiment of the present invention.

Next, a fourth example embodiment of the present invention will be described. FIG. 17 illustrates a configuration according to the fourth example embodiment. As illustrated in FIG. 17, a state change detection apparatus 100C according to the fourth example embodiment includes, in addition to the waveform acquisition unit 103, the state change feature value extraction unit 101, and the transition state extraction unit 102 according to the second example embodiment, a state change point storage unit 105, a steady state separation, extraction and storage unit 106, and a device-specific state extraction unit 107.

The waveform acquisition unit 103 may be connected to the measurement instrument 200 or include a measurement instrument, as described with reference to FIG. 24A. Alternatively, as described with reference to FIG. 25A, by using device disaggregation technology or the like, the waveform acquisition unit 103 may disaggregate a power supply current waveform measured by a current sensor connected to a main breaker, a branch breaker(s), or the like of a power distribution board and flowing through a plurality of electrical devices or a power supply current waveform measured by a smart meter and acquire disaggregated waveforms. The state change feature value extraction unit 101 and the transition state extraction unit 102 are the same as those described in the first and second example embodiments.

FIG. 18 illustrates an operation according to the fourth example embodiment. In FIG. 18, steps S10 and S11 are the same as steps S10 and S11 in FIG. 4. Step S12 in FIG. 18 is the same as step S12 in FIG. 4. Based on the magnitude of the state change feature value in the corresponding section of the current waveform data, the transition state extraction unit 102 determines whether the section corresponds to a steady state or a transition state and outputs time-series data of the steady state and the transition state. As illustrated in FIG. 18, the state change point storage unit 105 receives time-series data of a state (steady state, transition state) extracted by the transition state extraction unit 102, acquires state change point information (a change point from a steady state to a transition state or a change point from a transition state to a steady state), and stores the state change point information in sequence order in the storage device (105-4 in FIG. 19A) (step S13).

By using the state change point information stored in the storage device 105-4 by the state change point storage unit 105, the steady state separation, extraction and storage unit 106 classifies a current waveform data (time-series data) (clustering) (step S14). A method of the clustering of the current waveform data (time-series data) is not particularly limited, and any method, for example, a hierarchical method such as a shortest distance method or a non-hierarchical method such as a k-means method, may be used.

Regarding individual steady states before and after a state change point separated and extracted by the steady state separation, extraction and storage unit 106, for example, the device-specific state extraction unit 107 calculates a difference between the steady state feature values in a temporal order, to extract a feature value specific to the corresponding apparatus (step S15).

According to the present example embodiment, device-specific waveforms used for waveform analysis such as device disaggregation can automatically be acquired.

The following description will be made with a focus on the state change point storage unit 105, the steady state separation, extraction and storage unit 106, and the device-specific state extraction unit 107 according to the fourth example embodiment, which are different points from the first example embodiment.

Figure 19A:
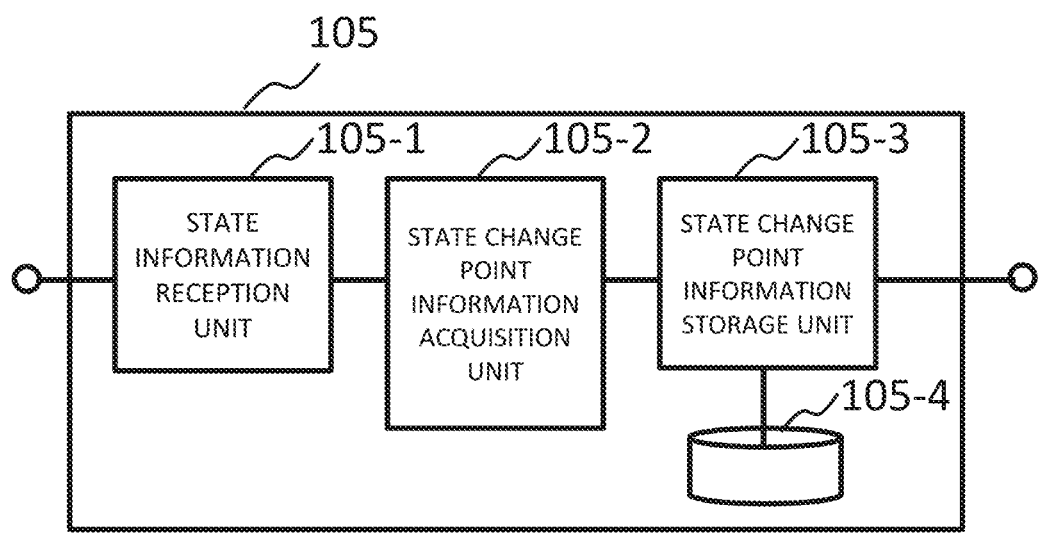
FIG. 19A is a diagram illustrating a configuration of state change point storage unit according to the fourth example embodiment of the present invention.

FIG. 19A illustrates a configuration example of the state change point storage unit 105 in FIG. 17. The state change point storage unit 105 includes a state information reception unit 105-1 that receives state information, a state change point information acquisition unit 105-2 that acquires information on a state change point, and a state change point information storing unit 105-3 that stores the information on a state change point in the storage device 105-4.

Figure 19B:
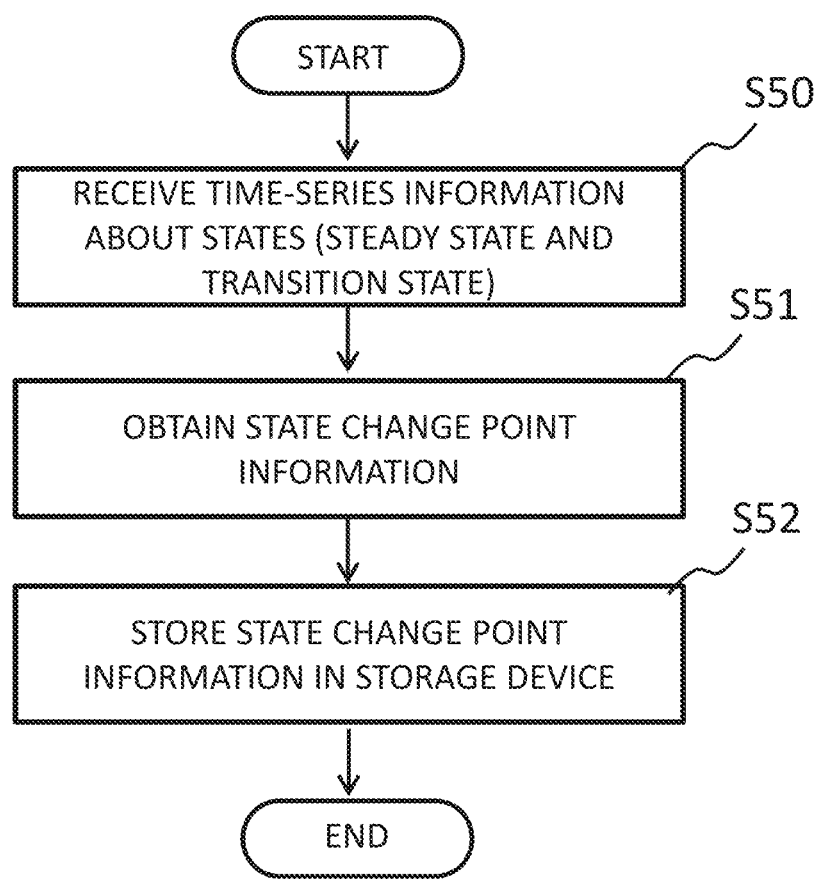
FIG. 19B is a flowchart illustrating an operation of the state change point storage unit according to the fourth example embodiment of the present invention.

FIG. 19B is a flowchart illustrating an operation of the state change point storage unit 105 in FIG. 19A. As illustrated in FIG. 19B, the state information reception unit 105-1 receives state time-series data (time-series data of a steady state and a transition state) extracted by the transition state extraction unit 102 (step S50).

The state change point information acquisition unit 105-2 acquires state change point information from the state time-series data (time-series data of the steady and transition states) (step S51). A state change point may include information about time of change and a kind of change (for example, whether a state has changed from a steady state to a transition state or from a transition state to a steady state).

The state change point information storing unit 105-3 stores the state change point information in the storage device 105-4 (step S52).

The information about a state change point may be information about time of change of a state and a binary value of 1 or 0 representing a transition state or a steady state as a value obtained as a result of the change (state change point information=(time information)+(binary information)).

Alternatively, the state change point information may be a state change feature value itself used by the transition state extraction unit 102 to determine a transition state or a steady state.

The state change point information storing unit 105-3 may store the current waveform data in time intervals determined as a steady state before and after a state change point as time-series data in the storage device 105-4, instead of storing the current waveform data at the state change point.

Figure 20A:
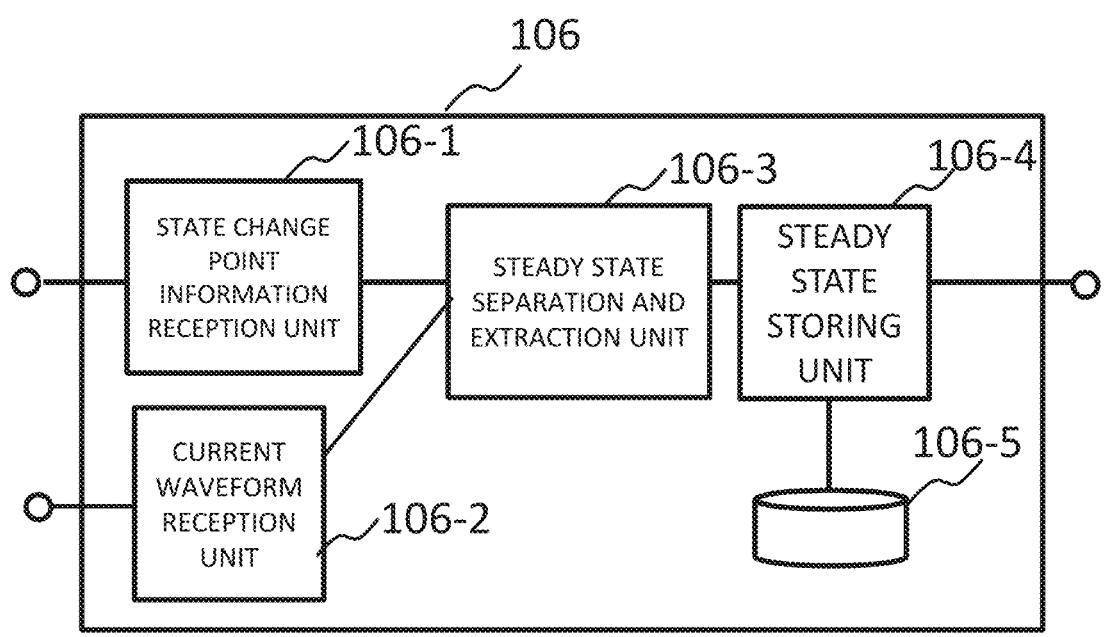
FIG. 20A is a diagram illustrating a configuration of steady state separation, extraction and storage unit according to the fourth example embodiment of the present invention.

FIG. 20A illustrates a configuration of the steady state separation, extraction and storage unit 106 in FIG. 17. As illustrated in FIG. 20A, the steady state separation, extraction and storage unit 106 includes a state change point information reception unit 106-1 that receives state change point information, a current waveform reception unit 106-2 that receives current waveform data, a steady state separation and extraction unit 106-3 that classifies a steady state current waveform, and a steady state storing unit 106-4 that stores the steady state current waveform (feature values) in a storage device 106-5.

FIG. 20B is a flowchart illustrating an operation of the steady state separation, extraction and storage unit 106 in FIG. 20A. As illustrated in FIG. 20B, the state change point information reception unit 106-1 receives state change point information stored in the storage device 105-4 by the state change point storage unit 105 (step S60).

The current waveform reception unit 106-2 receives current waveform data received by the waveform acquisition unit 103 (step S61).

Based on the state change point information, the steady state separation and extraction unit 106-3 classifies a steady state current waveform data (time-series data). For example, based on the feature values of steady states of the current waveform data (or power waveforms) before and after a state change point, the steady state separation and extraction unit 106-3 classifies and extracts the steady states (step S62).

From the current waveform data of the steady states before and after the state change point, the steady state separation and extraction unit 106-3 extracts feature values of the steady-state current waveform data and extracts a distribution, an average value, or the like of the feature values of the extracted steady-state current waveform data.

The steady state feature value may be the current waveform data itself.

Alternatively, the steady state separation and extraction unit 106-3 may use, as a steady state feature value, a feature value in the frequency domain obtained by performing Fourier transform on the current waveform data. The state change feature value may be used as a steady state feature value. Alternatively, for example, a sum of intensities of frequency components of odd-order harmonic components of the commercial power frequency or a sum of squares of intensities of the odd-order harmonic component may be used as the steady state feature values.

The steady state storing unit 106-4 stores the separated and extracted steady state current waveform data (feature values) in the storage device 106-5 (step S63).

Figure 21A:
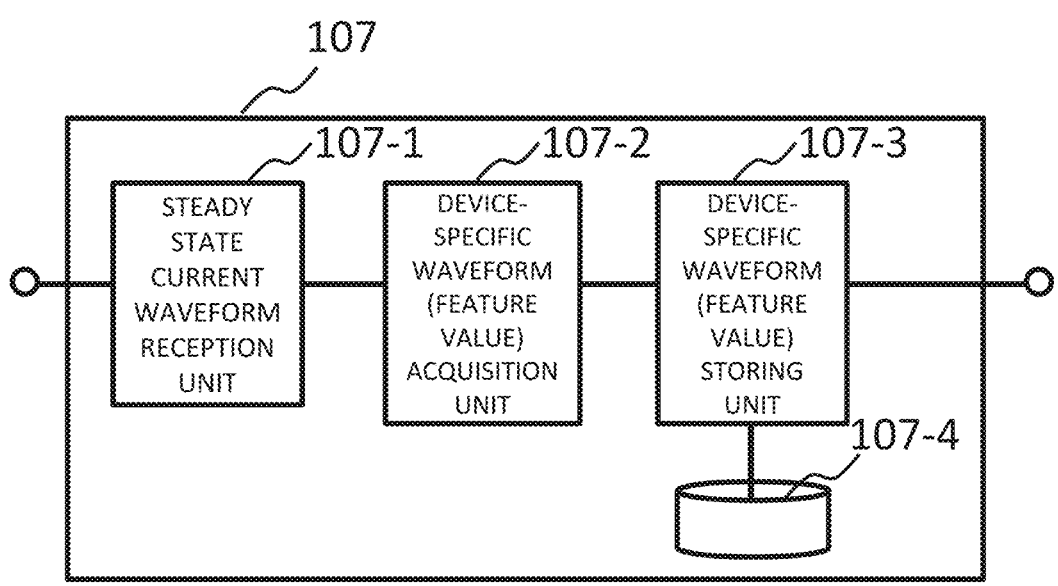
FIG. 21A is a diagram illustrating a configuration of device-specific state extraction unit according to the fourth example embodiment of the present invention.

FIG. 21A illustrates a configuration of the device-specific state extraction unit 107 in FIG. 17. As illustrated in FIG. 21A, the device-specific state extraction unit 107 includes a steady state current waveform reception unit 107-1 that receives current waveforms (feature values) of steady states, a device-specific waveform (feature value) acquisition unit 107-2 that acquires device-specific current waveforms (feature values) from current waveforms of steady states, and a device-specific waveform (feature value) storing unit 107-3 that stores the device-specific waveforms in the storage device 107-4.

Figure 21B:
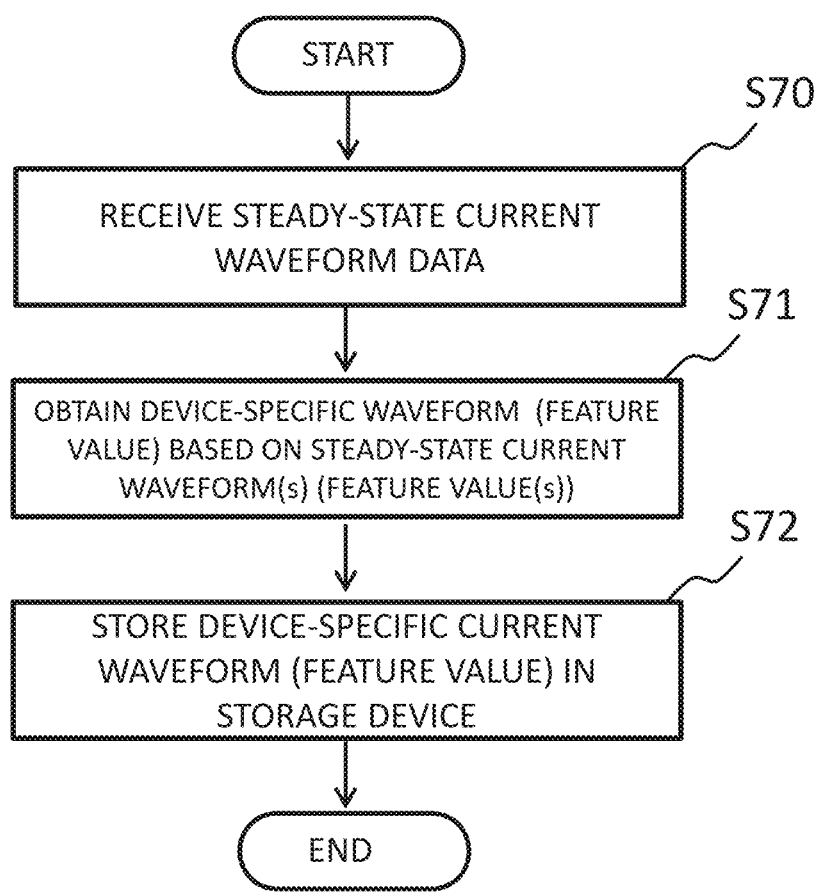
FIG. 21B is a flowchart illustrating an operation of the device-specific state extraction unit according to the fourth example embodiment of the present invention.

FIG. 21B is a flowchart illustrating an operation of the device-specific state extraction unit 107 in FIG. 21A. As illustrated in FIG. 21B, the steady state current waveform reception unit 107-1 receives time-series current waveform data of the individual steady states before and after a state change point, separated and extracted by the steady state separation, extraction and storage unit 106 (step S70).

For example, the device-specific waveform (feature value) acquisition unit 107-2 extracts a device-specific waveform (feature value) by calculating a difference between feature values of the steady states before and after a state change point (step S71). This is because, when the current waveform before a state change point changes from a steady state to a transition state and changes to a steady state again, a change amount of the current waveform feature value before and after the change corresponds to a feature value specific to the electrical device.

When the steady state feature value is steady state current waveform data itself, the device-specific waveform (feature value) acquisition unit 107-2 may extract a waveform specific to an individual electrical device by calculating a difference between the current waveform data of steady states before and after a state change point among the current waveform data of the individual steady states acquired by the steady state separation, extraction and storage unit 106. Namely, when a current waveform in a first stable state before a state change point changes to a current waveform in a transition state, which corresponds to the state change point, and changes to a current waveform in a second stable state after the state change point, a difference waveform, which is a difference between the current waveform in the second stable state and the current waveform in the first stable state, is obtained as a waveform specific to this electrical device.

The device-specific waveform (feature value) storage unit 107-2 stores the extracted device-specific waveform (or the feature value of this waveform) in the storage device 107-4 (step S72). The storage device 107-4 may be a waveform database or the like referred to for waveform analysis or the like described in Non-patent Literature 2, for example.

By calculating a difference between current waveform data (or corresponding feature values) of steady states before and after a state change point, the device-specific state extraction unit 107 extracts a waveform (feature value) specific to the corresponding electrical device. For example, in the case of the current waveform 311 in FIG. 9, as illustrated by the temporal change 314 of the state (transition state, steady state) in FIG. 9, the state changes over time from a first steady state (0 to 20 ms) to a second steady state (60 ms to 100 ms) via a transition state (20 ms to 60 ms). In this case, the device-specific state extraction unit 107 may calculate a difference between the current waveforms (or corresponding feature values) in the first steady state (0 to 20 ms) and the second steady state (60 to 100 ms) and uses the difference as a waveform (feature value) specific to this electrical device.

In addition, when comparing distributions of the current waveform data before and after a state change point, the device-specific waveform (feature value) acquisition unit 107-2 may perform pre-processing, for example, by matching the numbers of data points of the current waveform data of the respective steady states before and after the state change point, perform principal component analysis or the like, and extract a specific waveform.

For example, the device-specific waveform (feature value) acquisition unit 107-2 may match the numbers of data points of the current waveform data of the steady states before and after a state change point. For example, the device-specific waveform (feature value) acquisition unit 107-2 may reduce the larger number of data points of the current waveform data or increase the smaller number of data points between the current waveform data of the steady states before and after the state change point by using a random number of an obtained distribution. As described above, the device-specific state extraction unit 107 extracts a waveform specific to an individual apparatus.

According to the fourth example embodiment, as in the first example embodiment described with reference to FIG. 26, the unit of the state change detection apparatus 100C may, as a matter of course, be realized by a program executed by a computer.

According to the fourth example embodiment, a transition state can automatically be detected from power supply current waveform data representing an operation state of an electrical device, a steady state can automatically be classified, and a current waveform specific to this electrical device can automatically be extracted. Thus, the current waveform and power specific to an individual electrical device can automatically be extracted and trained. In addition, according to the fourth example embodiment, the state change feature value extraction unit 101 may calculate a state change feature value based on the current waveform data stored in advance in a storage device arranged inside or outside the state change detection apparatus 100C. In this case, the waveform acquisition unit 103 in FIG. 17 may not be used.

Variation 1 of Fourth Example Embodiment

Figure 22:
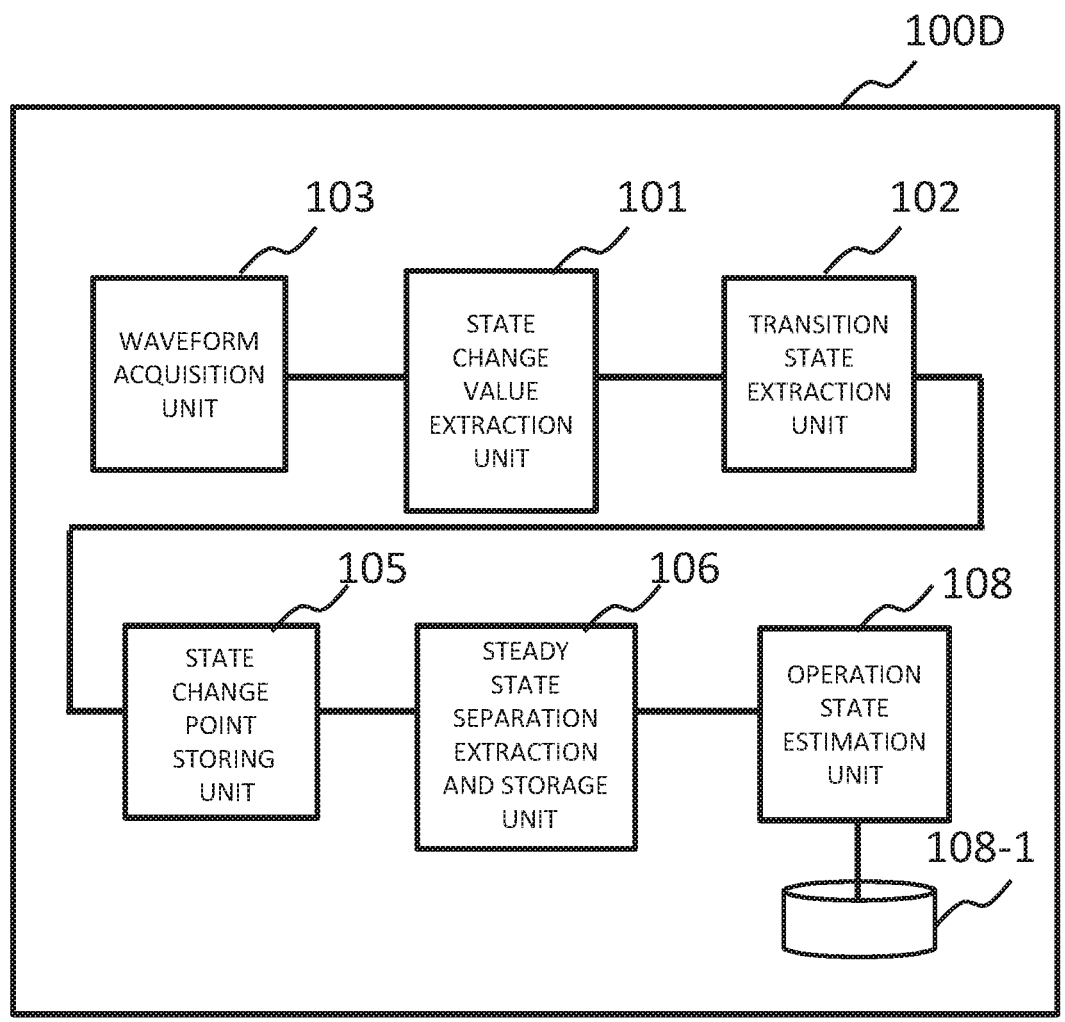
FIG. 22 illustrates variation 1 of the fourth example embodiment of the present invention.

Next, variation 1 of the fourth example embodiment of the present invention will be described. FIG. 22 illustrates variation 1.

As illustrated in FIG. 22, a state change detection apparatus 100D according to variation 1 includes a device operation state estimation unit 108, in place of the device-specific state extraction unit 107 in FIG. 17. In addition, the waveform acquisition unit 103 acquires power supply current waveform data of a single electrical device. The waveform acquisition unit 103 may acquire power supply current waveform data from the measurement instrument 200 described with reference to FIG. 24A. Alternatively, as illustrated in FIG. 25A, the waveform disaggregation unit 103-3 may disaggregate a power supply current waveform measured by the current sensor 23 or a smart meter connected to a main breaker, a branch breaker(s), or the like of a power distribution board and acquire a power supply current waveform flowing through a single electrical device. In FIG. 22, the state change feature value extraction unit 101, transition state extraction unit 102, state change point storage unit 105, and steady state separation, extraction and storage unit 106 are the same as those according to the above fourth example embodiment.

The operation state estimation unit 108 estimates an operation pattern (an operation state) of an electrical device by extracting a temporal order (order in time series) of feature values of steady state current waveform data obtained by the steady state separation, extraction and storage unit 106. For example, on/off, an operation pattern, power consumption, of an electrical device can be estimated as an operation state. For example, a frequency-domain feature value obtained by performing Fourier transform on current waveform data (for example, a state change feature value, a sum of intensities of frequency components of odd-order harmonic components of the commercial power frequency, or a sum of n-th powers of the intensities according to the first example embodiment) may be used as a steady state feature value. In addition, a steady state pattern may be acquired from a temporal change of the feature value. In addition, this pattern may be stored as an operation pattern of the electrical device in a storage device 108-1.

According to variation 1, from the operation pattern acquired by the operation state estimation unit 108, the temporal change of an operation state of the electrical device can be grasped and analyzed. According to variation 1, a transition pattern of a current waveform which leads to an individual operation mode of a specific electrical device can automatically be trained. Thus, the operation pattern of the specific electrical device can also be extracted. According to variation 1 of the fourth example embodiment, as in the first example embodiment, the state change feature value extraction unit 101 may calculate a state change feature value based on the current waveform data stored in advance in a storage device inside or outside the state change detection apparatus 100D. In this case, the waveform acquisition unit 103 in FIG. 17 may not be used.

Variation 2 of Fourth Example Embodiment

Figure 23:
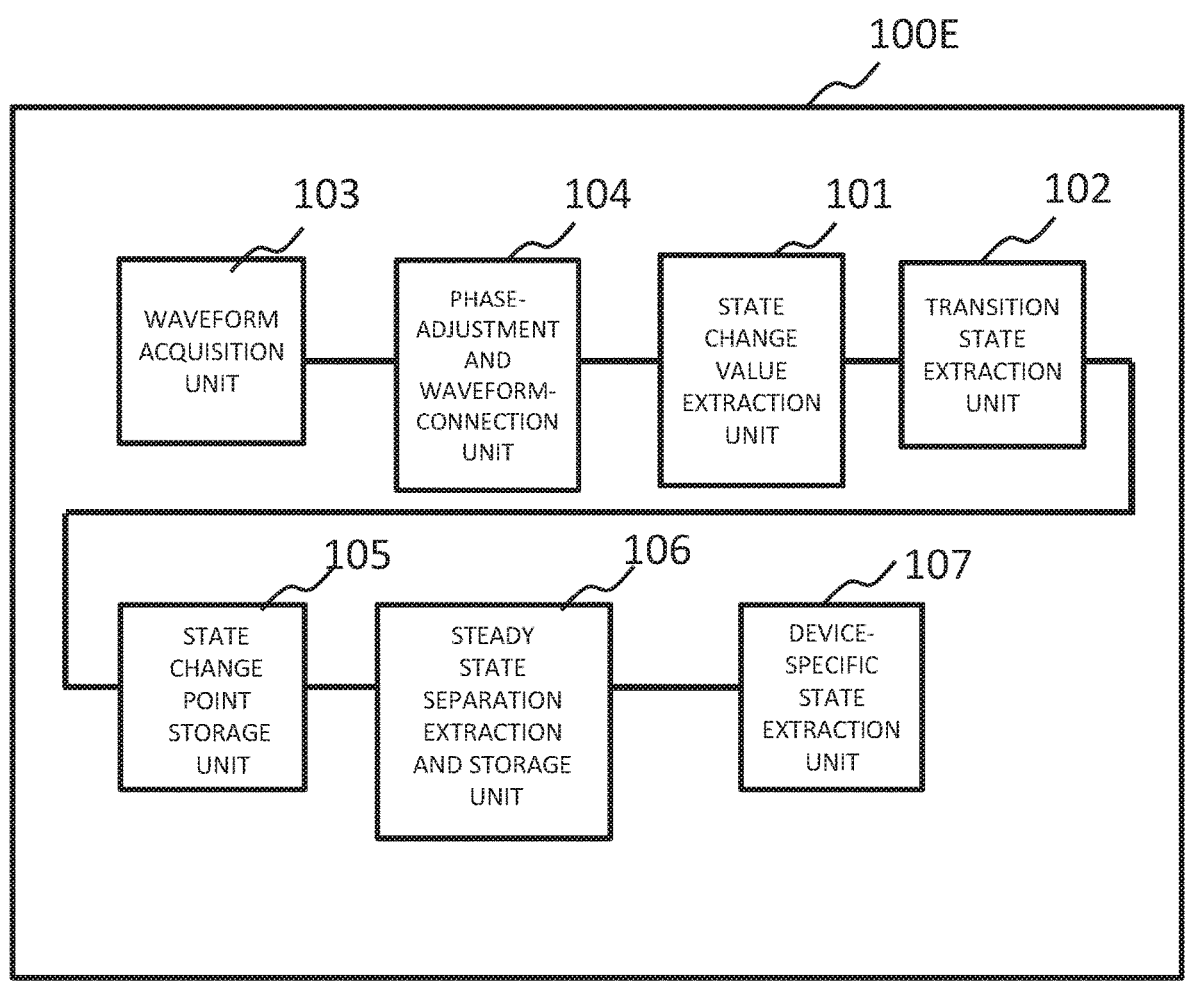
FIG. 23 illustrates variation 2 of the fourth example embodiment of the present invention.

Next, variation 2 of the fourth example embodiment of the present invention will be described. FIG. 23 illustrates a configuration according to variation 2 of the fourth example embodiment of the present invention. As illustrated in FIG. 23, a state change detection apparatus 100E according to variation 2 includes the phase-adjustment and waveform-connection unit 104 according to the above third example embodiment between the waveform acquisition unit 103 and the state change feature value extraction unit 101 according to the fourth example embodiment described with reference to FIG. 17.

According to variation 2, in addition to the operational advantage of the fourth example embodiment, even when data cannot continuously be measured because of performance of the apparatus or the like, the state transition can be detected by using the harmonics other than the odd-order harmonic components.

As a still another variation, the phase-adjustment and waveform-connection unit 104 according to the third example embodiment may be included between the waveform acquisition unit 103 and the state change feature value extraction unit 101 according to variation 1 of the fourth example embodiment described with reference to FIG. 22.

The disclosure of each of the above Patent Literatures 1 to 6 and Non-patent Literatures 1 and 2 is incorporated herein by reference thereto. Variations and adjustments of the example embodiments and the examples are possible within the scope of the overall disclosure (including the claims) of the present invention and based on the basic technical concept of the present invention. Various combinations and selections of various disclosed elements (including the elements in the claims, example embodiments, drawings, etc.) are possible within the scope of the disclosure of the present invention. Namely, the present invention of course includes various variations and modifications that could be made by those skilled in the art according to the overall disclosure including the claims and the technical concept.

The above example embodiments can be described, but not limited to, as the following supplementary notes.
(Supplementary Note 1)
A state change detection apparatus comprising:
a state change feature value extraction unit that extracts a state change feature value relating to power supply current waveform data; and
a transition state extraction unit that detects a transition state based on a magnitude of a state change feature value extracted from a section of the waveform data.
(Supplementary Note 2)
The state change detection apparatus according to supplementary note 1, wherein the state change feature value extraction unit calculates intensities of individual frequency components other than odd-order harmonic components of a power supply frequency in a frequency domain of the power supply current waveform data and calculates the state change feature value based on a sum of the individual intensities or a sum of n-th powers of the individual intensities (n is an integer of 2 of more).
(Supplementary Note 3)
The state change detection apparatus according to supplementary note 1 or 2, wherein the state change feature value extraction unit extracts the state change feature value from the power supply current waveform data of a predetermined length equal to or less than one cycle of the power supply frequency or the power supply current waveform data of a plurality of cycles of the power supply frequency.
(Supplementary Note 4)
The state change detection apparatus according to any one of supplementary notes 1 to 3, further comprising:
a phase-adjustment and waveform-connection unit that adjusts a phase of each waveform data which needs a phase alignment with respect to other waveform data, out of a plurality of sets of the waveform data of the power supply current, the plurality of sets of the waveform data differing from each other by one cycle or more of a power supply frequency, each of the plurality of sets of the waveform data having a length of one cycle or less of the power supply frequency, and then concatenates a plurality of sets of the waveform data having a length of one cycle or less of the power supply frequency with phase aligned, wherein the state change feature value extraction unit calculates the state change feature value for the plurality of sets of the waveform data, the plurality of sets of the waveform data having each a length of one cycle or less of the power supply frequency and being concatenated to each other by the phase-adjustment and waveform-connection unit.

(Supplementary Note 5)

The state change detection apparatus according to any one of supplementary notes 1 to 4, wherein, if the magnitude of the state change feature value is over a predetermined threshold, the transition state extraction unit determines that the corresponding section of the waveform data corresponds to a transition state and outputs a determination result; and wherein, if the magnitude of the state change feature value is equal to or less than the threshold, the transition state extraction unit determines that the corresponding section of the waveform data corresponds to a steady state and outputs a determination result.

(Supplementary Note 6)

The state change detection apparatus according to supplementary note 5, further comprising:

a state change point storage unit that receives time-series information about the steady state and the transition state detected by the transition state extraction unit and stores in a storage one or more state change points;

a steady state separation, extraction and storage unit that separates and extracts the waveform data of a steady state before and after the state change point; and a device-specific state extraction unit that extracts, based on the steady states separated and extracted, a waveform or a feature value specific to an electrical device.

(Supplementary Note 7)

The state change detection apparatus according to supplementary note 5, further comprising:

a state change point storage unit that receives time-series information about a steady state and a transition state detected by the transition state extraction unit and stores in a storage one or more state change points;

a steady state separation, extraction and storage unit that separates and extracts the waveform data of a steady state before and after the state change point; and an operation state estimation unit that performs training of feature values of the steady state waveform data separated and extracted and estimates an electrical device operation state based on the trained steady state feature values.

(Supplementary Note 8)

A computer based state change detection method of detecting a state change of an electrical device, the method comprising:

a state change feature value extraction step of extracting a state change feature value relating to power supply current waveform data; and a transition state extraction step of detecting a transition state based on a magnitude of a state change feature value extracted from an individual section of the waveform data.

(Supplementary Note 9)

The state change detection method according to supplementary note 8, wherein, in the state change feature value extraction step, intensities of individual frequency components other than odd-order harmonic components of a power supply frequency are calculated in a frequency domain of the power supply current waveform data, and the state change feature value is calculated based on a sum of the individual intensities or a sum of n-th powers of the individual intensities (n is an integer of 2 of more).

(Supplementary Note 10)

The state change detection method according to supplementary note 8 or 9, wherein, in the state change feature value extraction step, the state change feature value is extracted from the power supply current waveform data of a predetermined length equal to or less than one cycle of the power supply frequency or the power supply current waveform data of a plurality of cycles of the power supply frequency.

(Supplementary Note 11)

The state change detection method according to any one of supplementary notes 8 to 10, further comprising:

a phase-adjustment and waveform-connection step of adjusting a phase of each waveform data which needs a phase alignment with respect to other waveform data, out of a plurality of sets of the waveform data of the power supply current, the plurality of sets of the waveform data differing from each other by one cycle or more of a power supply frequency, each of the plurality of sets of the waveform data having a length of one cycle or less of the power supply frequency; and then concatenating a plurality of sets of the waveform data having a length of one cycle or less of the power supply frequency with phase aligned, wherein the state change feature value extraction step calculates a state change feature value for the plurality of sets of waveform data, the plurality of sets of waveform data having each a length of one cycle or less of the power supply frequency and concatenated to each other.

(Supplementary Note 12)

The state change detection method according to any one of supplementary notes 8 to 11, wherein, in the transition state extraction step, if the magnitude of the state change feature value is over a predetermined threshold, the corresponding section of the waveform data is determined to correspond to a transition state, and a determination result is outputted; and wherein, in the transition state extraction step, if the magnitude of the state change feature value is equal to or less than the threshold, the corresponding section of the waveform data is determined to correspond to a steady state, and a determination result is outputted.

(Supplementary Note 13)

The state change detection method according to supplementary note 12, further comprising:

a state change point storage step of receiving time-series information about the steady state and the transition state detected in the transition state extraction step and storing in a storage one or more state change points;

a steady state separation and extraction step of separates and extracts the waveform data of a steady state before and after the state change point; and a device-specific state extraction step of extracting, based on the steady states separated and extracted, a waveform or a feature value specific to an electrical device.

(Supplementary Note 14)

The state change detection method according to supplementary note 12, further comprising:

a state change point storage step of receiving time-series information about the steady state and the transition state detected in the transition state extraction step and storing in a storage one or more state change points;

a steady state separation and extraction step of separates and extracts the waveform data of a steady state before and after the state change point; and an operation state estimation step of performing training of feature values of the steady state waveform data separated and extracted and estimating an electrical device operation state based on the trained steady state feature values.

(Supplementary Note 15)

A non-transitory computer-readable recording medium storing a program causing a computer to execute:

a state change feature value extraction processing for extracting a state change feature value relating to power supply current waveform data; and a transition state extraction processing for detecting a transition state based on a magnitude of a state change feature value extracted from an individual section of the waveform data.

(Supplementary Note 16)

The non-transitory computer-readable recording medium according to supplementary note 15, wherein, in the state change feature value extraction processing, intensities of individual frequency components other than odd-order harmonic components of a power supply frequency are calculated in a frequency domain of the power supply current waveform data, and the state change feature value is calculated based on a sum of the individual intensities or a sum of n-th powers of the individual intensities (n is an integer of 2 of more).

(Supplementary Note 17)

The non-transitory computer-readable recording medium according to supplementary note 15 or 16, wherein, in the state change feature value extraction processing, the state change feature value is extracted from the power supply current waveform data of a predetermined length equal to or less than one cycle of the power supply frequency or the power supply current waveform data of a plurality of cycles of the power supply frequency.

(Supplementary Note 18)

The non-transitory computer-readable recording medium according to any one of supplementary notes 15 to 17, further comprising:

a phase-adjustment and waveform-connection processing for adjusting a phase of each waveform data which needs a phase alignment with respect to other waveform data, out of a plurality of sets of the waveform data of the power supply current, the plurality of sets of the waveform data differing from each other by one cycle or more of a power supply frequency, each of the plurality of sets of the waveform data having a length of one cycle or less of the power supply frequency; and then concatenating a plurality of sets of the waveform data having a length of one cycle or less of the power supply frequency with phase aligned, wherein the state change feature value extraction processing calculates a state change feature value for the plurality of sets of waveform data, the plurality of sets of waveform data having each a length of one cycle or less of the power supply frequency and being concatenated to each other by the phase-adjustment and waveform-connection processing.

(Supplementary Note 19)

The non-transitory computer-readable recording medium according to any one of supplementary notes 15 to 18, wherein, in the transition state extraction processing, if the magnitude of the state change feature value is over a predetermined threshold, a transition state is determined, and a determination result is outputted; and wherein, in the transition state extraction processing, if the magnitude of the state change feature value is equal to or less than the threshold, a steady state is determined, and a determination result is outputted.

(Supplementary Note 20)

The non-transitory computer-readable recording medium according to supplementary note 19, storing the program further causing the computer to execute:

a state change point storage processing for receiving time-series information about the steady state and the transition state detected in the transition state extraction processing and storing in a storage one or more state change points;

a steady state separation and extraction processing for separates and extracts the waveform data of a steady state before and after the state change point; and a device-specific state extraction processing for extracting, based on the steady states, a waveform or a feature value specific to an electrical device.

(Supplementary Note 21)

The non-transitory computer-readable recording medium according to supplementary note 19, storing the program further causing the computer to execute:

a state change point storage processing for receiving time-series information about the steady state and the transition state detected in the transition state extraction processing and storing in a storage one or more state change points;

a steady state separation and extraction processing for separates and extracts the waveform data of a steady state before and after the state change point; and an operation state estimation processing for performing training of feature values of the steady state waveform data separated and extracted and estimating an electrical device operation state based on the trained steady state feature values.

What is claimed is:

1. A state change detection apparatus comprising:
a processor;
a memory including program instructions executable by the processor;
a receiver configured to receive a power supply current signal transmitted from a current sensor that measures the power supply current signal flowing through a power supply line with at least an electric device connected thereto; and
a display apparatus,
wherein the processor is configured execute the program instructions to:
  extract a state change feature value from an individual section of waveform data of the power supply current signal, received by the receiver from the current sensor, by calculating individual intensities of individual frequency components other than odd-order harmonic components of a power supply frequency in a frequency domain of the individual section of the waveform data of the power supply current signal and calculating the state change feature value based on a sum of the individual intensities or a sum of n-th powers of the individual intensities, where n is an integer of 2 or more; and
  detect a transition state for the individual section of the waveform data, based on the state change feature value extracted,
wherein in a case where the state change feature value of the individual section of the waveform data exceeds a predetermined threshold, the processor determines that the individual section of the waveform data corresponds to the transition state and outputs a determination result to the display apparatus.

2. The state change detection apparatus according to claim 1, wherein when extracting the state change feature value, the processor extracts the state change feature value from the waveform data of the power supply current signal of a predetermined length equal to or less than one cycle of a power supply frequency or the waveform data of the power supply current signal of a plurality of cycles of the power supply frequency.

3. The state change detection apparatus according to claim 1, wherein the processor further:
adjusts a phase of each waveform data which needs a phase alignment with respect to other waveform data, out of a plurality of sets of the waveform data of the power supply current signal, the plurality of sets of the waveform data differing from each other by one cycle or more of a power supply frequency, each of the plurality of sets of the waveform data having a length of one cycle or less of the power supply frequency, and then concatenates a plurality of sets of the waveform data having a length of one cycle or less of the power supply frequency with phase aligned,
wherein when extracting the state change feature value, the processor calculates the state change feature value for the plurality of sets of the waveform data, the plurality of sets of the waveform data having each a length of one cycle or less of the power supply frequency and being concatenated to other.

4. The state change detection apparatus according to claim 1, wherein when extracting the transition state, in a case where the state change feature value of the individual section of the waveform data is equal to or less than the threshold, the processor determines that the individual section of the waveform data corresponds to a steady state and outputs the determination result to the display apparatus.

5. The state change detection apparatus according to claim 4, wherein the processor is further configured to execute:
a state change point storage processing that receives time-series information of the steady state and the transition state for each section of the waveform data detected by the transition state extraction processing and stores in a storage one or more state change points;
a steady state separation, extraction and storage processing that separates and extracts the waveform data of a steady state before and after the state change point; and
a device-specific state extraction processing that extracts, based on the steady states separated and extracted, a waveform or a feature value specific to the electrical device.

6. The state change detection apparatus according to claim 4, wherein the processor is further configured to execute:
a state change point storage processing that receives time-series information of the steady state and the transition state for each section of the waveform data detected by the transition state extraction processing and stores in a storage one or more state change points;
a steady state separation, extraction and storage processing that separates and extracts the waveform data of a steady state before and after the state change point; and
an operation state estimation processing that performs training of one or more feature values of the steady state waveform data separated and extracted and estimates an electrical device operation state, based on the trained one or more steady state feature values.

7. A computer based method of detecting a state change of an electrical device, the method comprising:
receiving, by a receiver, a power supply current signal transmitted from a current sensor that measures the power supply current signal flowing through a power supply line with at least an electric device connected thereto;
extracting a state change feature value from an individual section of waveform data of the power supply current signal, received by the receiver from the current sensor, by calculating individual intensities of individual frequency components other than odd-order harmonic components of a power supply frequency in a frequency domain of the individual section of the waveform data of the power supply current signal and calculating the state change feature value based on a sum of the individual intensities or a sum of n-th powers of the individual intensities, where n is an integer of 2 or more; and
detecting a transition state for the individual section of the waveform data, based on the state change feature value extracted from the individual section of the waveform data, in a case where the state change feature value of the individual section of the waveform data exceeds a predetermined threshold, and determining that the individual section of the waveform data corresponds to the transition state and outputting a determination result to a display apparatus.

8. The computer based method according to claim 7, wherein the extracting a state change feature value step comprises
extracting the state change feature value from the waveform data of the power supply current signal of a predetermined length equal to or less than one cycle of a power supply frequency or the waveform data of the power supply current signal of a plurality of cycles of the power supply frequency.

9. The computer based method according to claim 7, further comprising:
adjusting a phase of each waveform data which needs a phase alignment with respect to other waveform data, out of a plurality of sets of the waveform data of the power supply current signal, the plurality of sets of the waveform data differing from each other by one cycle or more of a power supply frequency, each of the plurality of sets of the waveform data having a length of one cycle or less of the power supply frequency; and
concatenating a plurality of sets of the waveform data having a length of one cycle or less of the power supply frequency with phase aligned,
wherein the extracting a state change feature value step comprises calculating the state change feature value for the plurality of sets of the waveform data, the plurality of sets of the waveform data having each a length of one cycle or less of the power supply frequency and being concatenated to each other.

10. The computer based method according to claim 7, wherein, when extracting the transition state,
the state change feature value of the individual section of the waveform data is equal to or less than the threshold, determining that the section of the waveform data corresponds to a steady state and outputs a determination result to the display apparatus.

11. The computer based method according to claim 10, comprising:
receiving time-series information of the steady state and the transition state for each section of the waveform data detected by the transition state extraction step and storing in a storage one or more state change points;
separating and extracting the waveform data of a steady state before and after the state change point; and
extracting, based on the steady states separated and extracted, a waveform or a feature value specific to the electrical device.

12. The computer based method according to claim 10, comprising:

receiving time-series information of the steady state and the transition state for each section of the waveform data detected by the transition state extraction step and storing in a storage one or more state change points;

separating and extracting the waveform data of a steady state before and after the state change point; and performing training of one or more feature values of the steady state waveform data separated and extracted and estimating an electrical device operation state, based on the trained one or more steady state feature values.

13. A non-transitory computer readable recording medium storing therein a program, the program causing a computer to execute:

receiving, by a receiver, a power supply current signal transmitted from a current sensor that measures the power supply current signal flowing through a power supply line with at least an electric device connected thereto;

extracting a state change feature value from an individual section of waveform data of the power supply current signal, received by the receiver from the current sensor, by calculating individual intensities of individual frequency components other than odd-order harmonic components of a power supply frequency in a frequency domain of the individual section of the waveform data of the power supply current signal and calculating the state change feature value based on a sum of the individual intensities or a sum of n-th powers of the individual intensities, where n is an integer of 2 or more; and detecting a transition state for the individual section of the waveform data, based on the state change feature value extracted from the individual section of the waveform data, in a case where the state change feature value of the individual section of the waveform data exceeds a predetermined threshold, and determining that the individual section of the waveform data corresponds to the transition state and outputting a determination result to a display apparatus.

14. The non-transitory computer readable recording medium according to claim 13, wherein the program causes the computer to execute:

when extracting the state change feature value, extracting the state change feature value from the waveform data of the power supply current signal of a predetermined length equal to or less than one cycle of a power supply frequency or the waveform data of the power supply current signal of a plurality of cycles of the power supply frequency.

15. The non-transitory computer readable recording medium according to claim 13, wherein the program causes the computer to execute:

adjusting a phase of each waveform data which needs a phase alignment with respect to other waveform data, out of a plurality of sets of the waveform data of the power supply current signal, the plurality of sets of the waveform data differing from each other by one cycle or more of a power supply frequency, each of the plurality of sets of the waveform data having a length of one cycle or less of the power supply frequency; and concatenating a plurality of sets of the waveform data having a length of one cycle or less of the power supply frequency with phase aligned, wherein the program causes the computer to execute:

when extracting the state change feature value, calculating the state change feature value for the plurality of sets of the waveform data, the plurality of sets of the waveform data having each a length of one cycle or less of the power supply frequency and being concatenated to each other.

16. The non-transitory computer readable recording medium according to claim 13, wherein the program causes the computer to execute:

when extracting the transition state in a case where the magnitude of the state change feature value of the individual section of the waveform data is equal to or less than the threshold, determining that the individual section of the waveform data corresponds to a steady state to output the determination result to the display apparatus.

17. The non-transitory computer readable recording medium according to claim 16, wherein the program causes the computer to execute:

receiving time-series information of the steady state and the transition state for each section of the waveform data detected by the transition state extraction processing and storing in a storage one or more state change points;

separating and extracting the waveform data of a steady state before and after the state change point; and extracting, based on the steady states separated and extracted, a waveform or a feature value specific to the electrical device.

* * * * *